(12) United States Patent
Goth et al.

(10) Patent No.: US 8,514,575 B2
(45) Date of Patent: Aug. 20, 2013

(54) MULTIMODAL COOLING APPARATUS FOR AN ELECTRONIC SYSTEM

(75) Inventors: Gary F. Goth, Pleasant Valley, NY (US); William P. Kostenko, Poughkeepsie, NY (US); Robert K. Mullady, Poughkeepsie, NY (US); Allan C. Vandeventer, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 345 days.

(21) Appl. No.: 12/947,293

(22) Filed: Nov. 16, 2010

(65) Prior Publication Data

US 2012/0118534 A1   May 17, 2012

(51) Int. Cl.
*H05K 7/20* (2006.01)
(52) U.S. Cl.
USPC .......................... 361/698; 361/691; 62/259.2
(58) Field of Classification Search
USPC .................. 361/679.46–679.53, 688–701
See application file for complete search history.

(56) References Cited

U.S. PATENT DOCUMENTS

| | | |
|---|---|---|
| 3,754,596 A | 8/1973 | Ward, Jr. |
| 5,198,962 A | 3/1993 | Tyson |
| 5,752,011 A | 5/1998 | Thomas et al. |
| 5,974,557 A | 10/1999 | Thomas et al. |
| 6,349,391 B1 | 2/2002 | Petivan et al. |
| 6,374,627 B1 | 4/2002 | Schumacher et al. |
| 6,494,050 B2 | 12/2002 | Spinazzola et al. |
| 6,535,798 B1 | 3/2003 | Bhatia et al. |
| 6,587,343 B2 | 7/2003 | Novotny et al. |
| 6,763,880 B1 | 7/2004 | Shih |
| 6,807,056 B2 | 10/2004 | Kondo et al. |
| 6,819,563 B1 * | 11/2004 | Chu et al. .................. 361/696 |
| 6,854,284 B2 | 2/2005 | Bash et al. |

(Continued)

FOREIGN PATENT DOCUMENTS

DE           19845821 B4      4/2000

OTHER PUBLICATIONS

Campbell et al., Notice of Allowance for U.S Appl. No. 12/947,302, filed Nov. 16, 2010 (U.S. Patent Publication No. 2012/0118534 A1), dated May 24, 2012.

(Continued)

*Primary Examiner* — Courtney Smith
(74) *Attorney, Agent, or Firm* — Dennis Jung, Esq.; Kevin P. Radigan, Esq.; Heslin Rothenberg Farley & Mesiti P.C.

(57) ABSTRACT

An apparatus is provided for cooling an electronic system, which includes one or more electronic components across which air passing through the system flows. A cooling unit provides, via a coolant loop, system coolant to cool the electronic component(s), and to an air-to-liquid heat exchanger is coupled to the coolant loop downstream of the electronic component(s) to cool, in primary, liquid-cooling mode, air passing through the system. In primary, liquid-cooling mode, the cooling unit provides cooled system coolant to cool the electronic component(s), and provides system coolant to the air-to-liquid heat exchanger to cool at least a portion of air passing through the electronic system, and in a secondary, air-cooling mode, system coolant flows from cooling the electronic component(s) to the air-to-liquid heat exchanger for rejecting, via the system coolant, heat from the electronic component(s) to air passing across the air-to-liquid heat exchanger.

20 Claims, 12 Drawing Sheets

(56) References Cited

U.S. PATENT DOCUMENTS

| | | |
|---|---|---|
| 6,854,287 B2 | 2/2005 | Patel et al. |
| 6,867,970 B2 | 3/2005 | Muller et al. |
| 6,896,612 B1 | 5/2005 | Novotny |
| 6,927,980 B2 | 8/2005 | Fukuda et al. |
| 6,968,709 B2 | 11/2005 | Goth et al. |
| 6,973,801 B1 | 12/2005 | Campbell et al. |
| 6,997,006 B2 | 2/2006 | Kameyama et al. |
| 7,002,799 B2 | 2/2006 | Malone et al. |
| 7,011,143 B2 | 3/2006 | Corrado et al. |
| 7,086,247 B2 | 8/2006 | Campbell et al. |
| 7,106,590 B2 | 9/2006 | Chu et al. |
| 7,110,260 B2 | 9/2006 | Weber et al. |
| 7,219,247 B2 | 5/2007 | Law et al. |
| 7,236,363 B2 | 6/2007 | Belady |
| 7,315,448 B1 * | 1/2008 | Bash et al. ............... 361/701 |
| 7,400,505 B2 | 7/2008 | Campbell et al. |
| 7,418,825 B1 | 9/2008 | Bean, Jr. |
| 7,430,118 B1 * | 9/2008 | Noteboom et al. ........... 361/695 |
| 7,436,666 B1 | 10/2008 | Konshak |
| 7,486,513 B2 | 2/2009 | Hall et al. |
| 7,500,911 B2 * | 3/2009 | Johnson et al. ............... 454/184 |
| 7,534,167 B2 | 5/2009 | Day |
| 7,641,101 B2 | 1/2010 | Campbell et al. |
| 7,647,787 B2 | 1/2010 | Belady et al. |
| 7,757,506 B2 | 7/2010 | Ellsworth, Jr. et al. |
| 7,788,940 B2 | 9/2010 | Madara et al. |
| 7,867,070 B2 | 1/2011 | Day |
| 7,907,406 B1 | 3/2011 | Campbell et al. |
| 7,944,694 B2 | 5/2011 | Campbell et al. |
| 8,018,718 B2 * | 9/2011 | Goth et al. ............... 361/699 |
| 8,208,258 B2 * | 6/2012 | Campbell et al. ............. 361/699 |
| 2004/0221604 A1 | 11/2004 | Ota et al. |
| 2005/0061541 A1 | 3/2005 | Belady |
| 2005/0115257 A1 * | 6/2005 | Goth et al. ............... 62/186 |
| 2006/0002086 A1 | 1/2006 | Teneketges et al. |
| 2006/0065000 A1 | 3/2006 | Belady |
| 2006/0269807 A1 * | 11/2006 | Fujita et al. .................. 429/26 |
| 2007/0101334 A1 | 5/2007 | Atyam et al. |
| 2007/0119569 A1 | 5/2007 | Campbell et al. |
| 2007/0193291 A1 * | 8/2007 | Reddin et al. .................. 62/239 |
| 2007/0227710 A1 | 10/2007 | Belady et al. |
| 2008/0205003 A1 * | 8/2008 | Belady ......................... 361/700 |
| 2009/0086428 A1 | 4/2009 | Campbell et al. |
| 2009/0086432 A1 | 4/2009 | Campbell et al. |
| 2009/0126909 A1 | 5/2009 | Ellsworth, Jr. et al. |
| 2010/0067193 A1 | 3/2010 | Arimilli et al. |
| 2010/0236772 A1 | 9/2010 | Novotny et al. |
| 2010/0263855 A1 | 10/2010 | Arimilli et al. |
| 2010/0277865 A1 * | 11/2010 | Goth et al. ............... 361/679.53 |
| 2011/0056674 A1 * | 3/2011 | Campbell et al. ............. 165/247 |
| 2011/0075372 A1 | 3/2011 | Zimbeck et al. |
| 2012/0118534 A1 | 5/2012 | Goth et al. |

OTHER PUBLICATIONS

Morgan, "IBM Hints at Triple Redundancy in Power6", (http://www.itjungle.com/breaking/bn032906-story-1.html) (Mar. 29, 2006).

Arent, "Liquid Coolant Distribution Unit with Convertible Air or Water Cooling", IBM Technical Disclosure Bulletin, IP Prior Art Database, IP.com No. IPCOM000044828D (Feb. 6, 2005).

Delia et al., "System Cooling Design for the Water-Cooled IBM Enterprise System/900 Processors", IBM Journal of Research and Development, vol. 36, No. 4, pp. 791-803 (Jul. 1992).

* cited by examiner

MULTIMODAL COOLING APPARATUS FOR AN ELECTRONIC SYSTEM

BACKGROUND

The present invention relates in general to apparatuses and methods for facilitating operation of (for example) rack-mounted assemblages of individual electronic units, such as rack-mounted computer server units.

The power dissipation of integrated circuit chips, and the modules containing the chips, continues to increase in order to achieve increases in processor performance. This trend poses a cooling challenge at both module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the availability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid coolant.

BRIEF SUMMARY

In one aspect, the shortcomings of the prior art are overcome and additional advantages are provided through provision of a cooling apparatus for facilitating cooling of an electronic system. The cooling apparatus includes: at least one cooling unit, at least one air-to-liquid heat exchanger and a controller. The at least one cooling unit is configured to provide, via a coolant loop, system coolant to cool at least one electronic component of the electronic system, wherein each cooling unit comprises a liquid-to-liquid heat exchanger, a first coolant path and a second coolant path. The first coolant path of each cooling unit receives, in a primary, liquid-cooling mode, facility coolant from a source and passes at least a portion thereof through the liquid-to-liquid heat exchanger, and the second coolant path is coupled in fluid communication with the coolant loop, and provides system coolant to cool the at least one electronic component, and in the primary liquid-cooling mode, expels heat in the liquid-to-liquid heat exchanger from system coolant in the second coolant path to facility coolant in the first coolant path. The at least one air-to-liquid heat exchanger cools, in the primary, liquid-cooling mode, at least a portion of air passing through the electronic system, and is coupled to the coolant loop to receive system coolant therefrom and exhaust system coolant thereto. The at least one air-to-liquid heat exchanger is coupled to the coolant loop downstream of the at least one electronic component, and in a secondary, air-cooling mode, the air-to-liquid heat exchanger(s) facilitates cooling the at least one electronic component. The controller transitions the cooling apparatus between the primary, liquid-cooling mode and the secondary, air-cooling mode, wherein in primary, liquid-cooling mode, the at least one cooling unit provides cool system coolant to cool the at least one electronic component, and provides system coolant to the at least one air-to-liquid heat exchanger to cool at least a portion of air passing through the electronic system, and in secondary, air-cooling mode, system coolant flows from cooling the at least one electronic component to the at least one air-to-liquid heat exchanger for rejecting, via the system coolant, heat from the at least one electronic component to air passing across the at least one air-to-liquid heat exchanger.

In another aspect, a cooled electronic system is provided which includes an electronic system, comprising an air inlet side and an air outlet side respectively allowing ingress and egress of air through the system, and a cooling apparatus for facilitating cooling of the electronic system. The cooling apparatus includes: at least one cooling unit, at least one air-to-liquid heat exchanger and a controller. The at least one cooling unit is configured to provide, via a coolant loop, system coolant to cool at least one electronic component of the electronic system, wherein each cooling unit comprises a liquid-to-liquid heat exchanger, a first coolant path and a second coolant path. The first coolant path of each cooling unit receives, in a primary, liquid-cooling mode, facility coolant from a source and passes at least a portion thereof through the liquid-to-liquid heat exchanger, and the second coolant path is coupled in fluid communication with the coolant loop, and provides system coolant to cool the at least one electronic component, and in the primary, liquid-cooling mode, expels heat in the liquid-to-liquid heat exchanger from system coolant in the second coolant path to facility coolant in the first coolant path. The at least one air-to-liquid heat exchanger cools, in the primary, liquid-cooling mode, at least a portion of air passing through the electronic system, and is coupled to the coolant loop to receive system coolant therefrom and exhaust system coolant thereto. The at least one air-to-liquid heat exchanger is coupled to the coolant loop downstream of the at least one electronic component, and in a secondary, air-cooling mode, the air-to-liquid heat exchanger(s) facilitates cooling the at least one electronic component. The controller transitions the cooling apparatus between the primary, liquid-cooling mode and the secondary, air-cooling mode, wherein in primary, liquid cooling mode, the at least one cooling unit provides cool system coolant to cool the at least one electronic component, and provides system coolant to the at least one air-to-liquid heat exchanger to cool at least a portion of air passing through the electronic system, and in secondary, air-cooling mode, system coolant flows from cooling the at least one electronic component to the at least one air-to-liquid heat exchanger for rejecting, via the system coolant, heat from the at least one electronic component to air passing across the at least one air-to-liquid heat exchanger.

In a further aspect, a method of facilitating cooling of an electronic system is provided. The method includes: employing at least one cooling unit configured to provide, via a coolant loop, system coolant to cool at least one electronic component of the electronic system, wherein each cooling unit comprises a liquid-to-liquid heat exchanger, a first coolant path and a second coolant path, the first coolant path of each cooling unit receiving, in a primary, liquid-cooling mode, facility coolant from a source and passing at least a portion thereof through the liquid-to-liquid heat exchanger, and the second coolant path being coupled in fluid communication with the coolant loop, and providing system coolant to cool the at least one electronic component, and in primary, liquid-cooling mode, expelling heat in the liquid-to-liquid heat exchanger from system coolant in the second coolant path to facility coolant in the first coolant path; utilizing at least one air-to-liquid heat exchanger for cooling, in primary, liquid-cooling mode, at least a portion of air passing through the electronic system, the at least one air-to-liquid heat exchanger being coupled to the coolant loop to receive system coolant therefrom and exhaust system coolant thereto, wherein the at least one air-to-liquid heat exchanger is coupled to the coolant loop downstream of cooling the at least one electronic component, and in a secondary, air-cooling mode, the at least one air-to-liquid heat exchanger facilitates cooling the at least one electronic component; and transitioning between the primary, liquid-cooling mode and the secondary, air-cooling mode, wherein in primary, liquid-cooling mode, the at least one cooling unit provides cooled system coolant to cool the at least one electronic component, and provides system coolant to the at least one air-to-liquid heat exchanger for cooling at least a portion of the air passing through the electronic system, and in secondary, air-cooling mode, system coolant flows from cooling the at least one electronic component to the at least one air-to-liquid heat exchanger for rejecting, via the system coolant, heat from the at least one electronic component to air passing across the at least one air-to-liquid heat exchanger.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
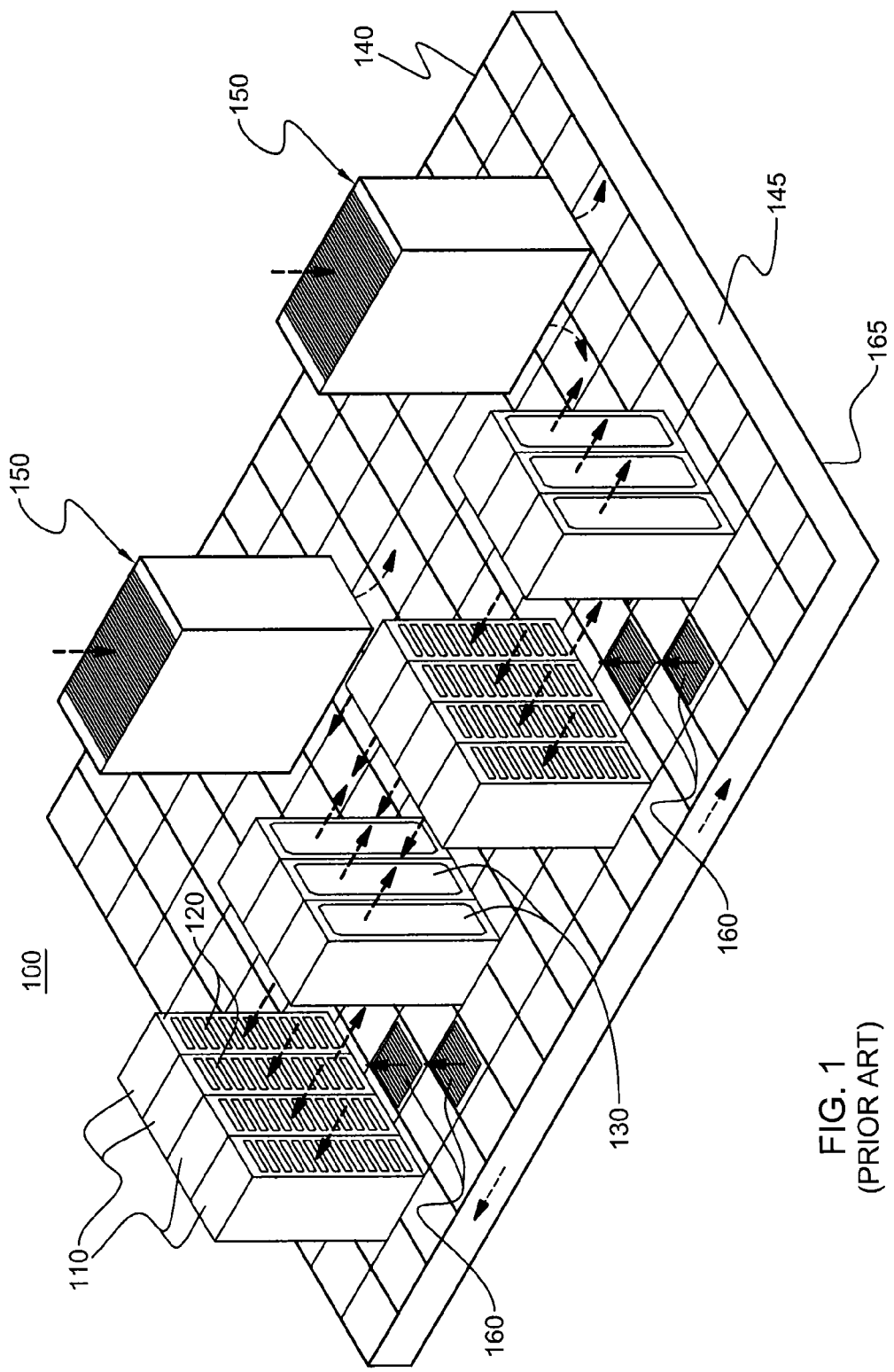
FIG. 1 depicts one embodiment of a conventional raised floor layout of an air-cooled computer installation.

As used herein, the term "electronic system" refers to any structure, housing, frame, compartment, enclosure, or rack having one or more heat-generating components of a computer system or electronic system disposed therein, and may be, for example, a laptop computer, a desktop computer, a workstation, a computer server unit, an electronics rack, etc. The terms "electronics rack", "rack-mounted electronic equipment", and "rack unit" are used interchangeably, and unless otherwise specified include any housing, frame, rack, compartment, blade server system, etc., having one or more heat generating components of a computer system or electronic system, and may be, for example, a stand alone computer processor having high, mid or low end processing capability. In one embodiment, an electronics rack may comprise multiple electronic subsystems, each having one or more heat generating components disposed therein requiring cooling. "Electronic subsystem" refers to any sub-housing, blade, book, drawer, node, compartment, etc., having one or more heat generating electronic components disposed therein. Each electronic subsystem of an electronics rack may be movable or fixed relative to the electronics rack, with the rack-mounted electronic drawers of a multi-drawer rack unit and blades of a blade center system being two examples of subsystems of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. As used herein, "primary heat generating component" refers to a primary heat generating electronic component within an electronic subsystem, while "secondary heat generating component" refers to an electronic component of the electronic subsystem generating less heat than the primary heat generating component to be cooled. "Primary heat generating die" refers, for example, to a primary heat generating die or chip within a heat generating electronic component comprising primary and secondary heat generating dies (with a processor die being one example). "Secondary heat generating die" refers to a die of a multi-die electronic component generating less heat than the primary heat generating die thereof (with memory dies and memory support dies being examples of secondary dies to be cooled). As one example, a heat generating electronic component could comprise multiple primary heat generating bare dies and multiple secondary heat generating dies on a common carrier. Further, unless otherwise specified herein, the term "liquid-cooled cold plate" refers to any conventional thermally conductive structure having a plurality of channels or passageways formed therein for flowing of liquid coolant therethrough. In addition, "metallurgically bonded" refers generally herein to two components being welded, brazed or soldered together by any means.

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchanger may vary without departing from the scope of the invention disclosed herein. A "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention.

Reference is made below to the drawings, which are not drawn to scale for reasons of understanding, wherein the same reference numbers used throughout different figures designate the same or similar components.

As shown in FIG. 1, in a raised floor layout of an air cooled computer installation 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have an air moving device (e.g., fan or blower) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air-conditioning units 150, also disposed within the computer installation 100. Room air is taken into each air-conditioning unit 150 near an upper portion thereof. This room air comprises in part exhausted air from the "hot" aisles of the computer installation defined by opposing air outlet sides 130 of the electronics racks 110.

Figure 2:
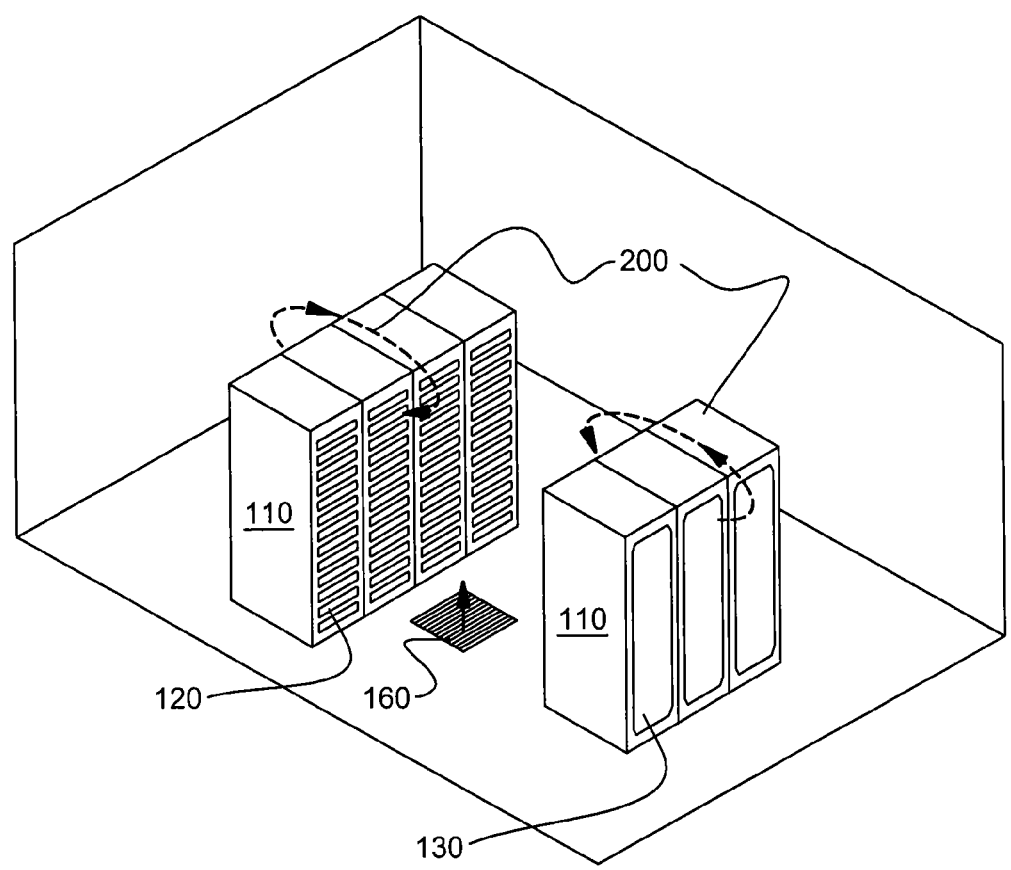
FIG. 2 depicts one problem addressed by an aspect of the present invention, showing recirculation airflow patterns in one implementation of a raised floor layout of an air-cooled computer installation, in accordance with an aspect of the present invention.

Due to the ever increasing air flow requirements through electronics racks, and limits of air distribution within the typical computer room installation, recirculation problems within the room may occur. This is shown in FIG. 2 for a raised floor layout, wherein hot air recirculation 200 occurs from the air outlet sides 130 of the electronics racks back to the cold air aisle defined by the opposing air inlet sides 120 of the electronics rack. This recirculation can occur because the conditioned air supplied through tiles 160 is typically only a fraction of the air flow rate forced through the electronics racks by the air moving devices disposed therein. This can be due, for example, to limitations on the tile sizes (or diffuser flow rates). The remaining fraction of the supply of inlet side air is often made up by ambient room air through recirculation 200. This re-circulating flow is often very complex in nature, and can lead to significantly higher rack unit inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 18-35° C. range. For a raised floor layout such as depicted in FIG. 1, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to a lower processing capacity. Also, computer installation equipment almost always represents a high capital investment to the customer. Thus, it is of significant importance, from a product reliability and performance view point, and from a customer satisfaction and business perspective, to maintain the temperature of the inlet air uniform. The efficient cooling of such computer and electronic systems, and the amelioration of localized hot air inlet temperatures to one or more rack units due to recirculation of air currents, are addressed by the apparatuses and methods disclosed herein.

Figure 3:
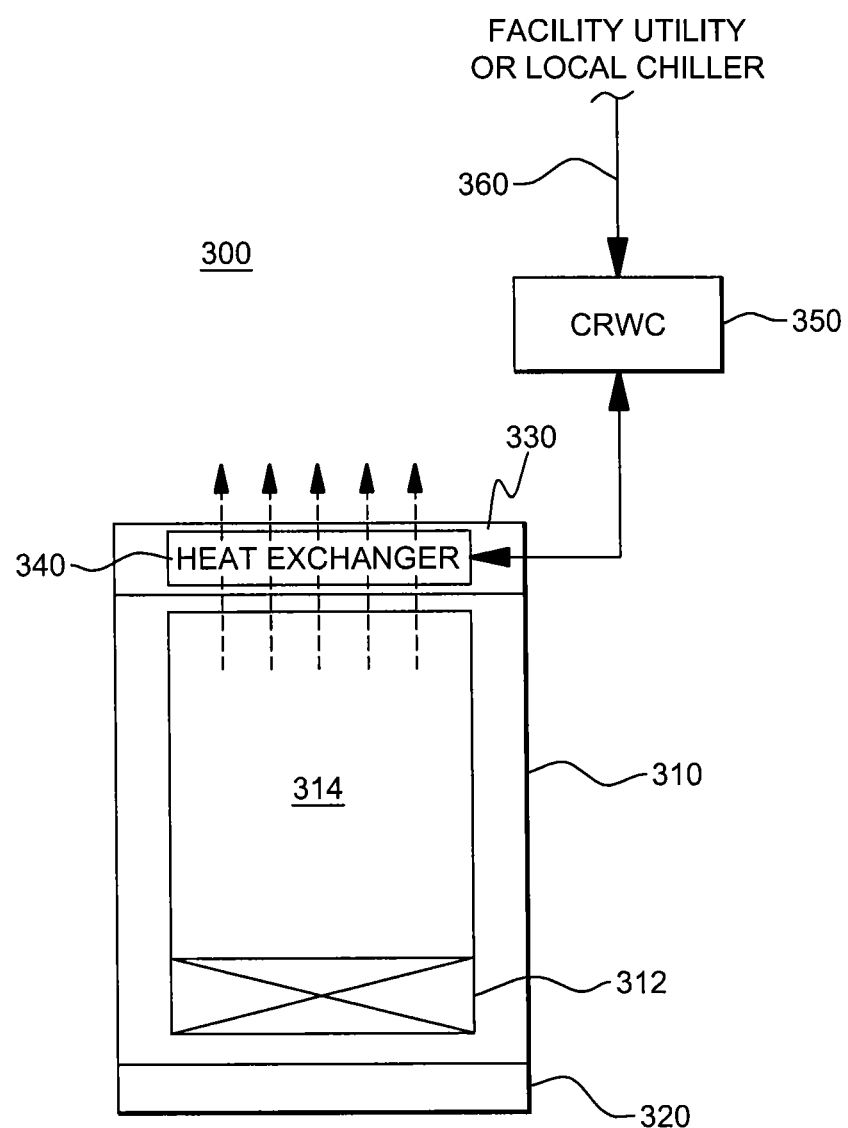
FIG. 3 is a cross-sectional plan view of one embodiment of an electronics rack utilizing at least one air-to-liquid heat exchanger disposed at the air outlet side of the electronics rack, in accordance with an aspect of the present invention.

FIG. 3 depicts one embodiment of a cooled electronic system, generally denoted 300, in accordance with an aspect of the present invention. In this embodiment, electronic system 300 includes an electronics rack 310 having an inlet door cover 320 and an outlet door cover 330 which have openings to allow for the ingress and egress of external air from the inlet side to the outlet side of the electronics rack 310. The system further includes at least one air moving device 312 for moving external air across at least one electronic drawer unit 314 positioned within the electronics rack. Disposed within outlet door cover 330 is a heat exchange assembly 340. Heat exchange assembly 340 includes an air-to-liquid heat exchanger through which the inlet-to-outlet air flow through the electronics rack passes. A computer room water conditioner (CRWC) 350 is used to buffer heat exchange assembly 340 from the building utility or local chiller coolant 360, which is provided as input to CRWC 350. The CRWC 350 provides system water or system coolant to heat exchange assembly 340. Heat exchange assembly 340 removes heat from the exhausted inlet-to-outlet air flow through the electronics rack for transfer via the system water or coolant to CRWC 350. Advantageously, providing a heat exchange assembly with an air-to-liquid heat exchanger such as disclosed herein at the outlet door cover of one or more electronics racks in a computer installation can, in normal operation, significantly reduce heat loads on existing air conditioning units within the computer installation, and facilitate the cooling of the rack-mounted electronics units.

Figure 4:
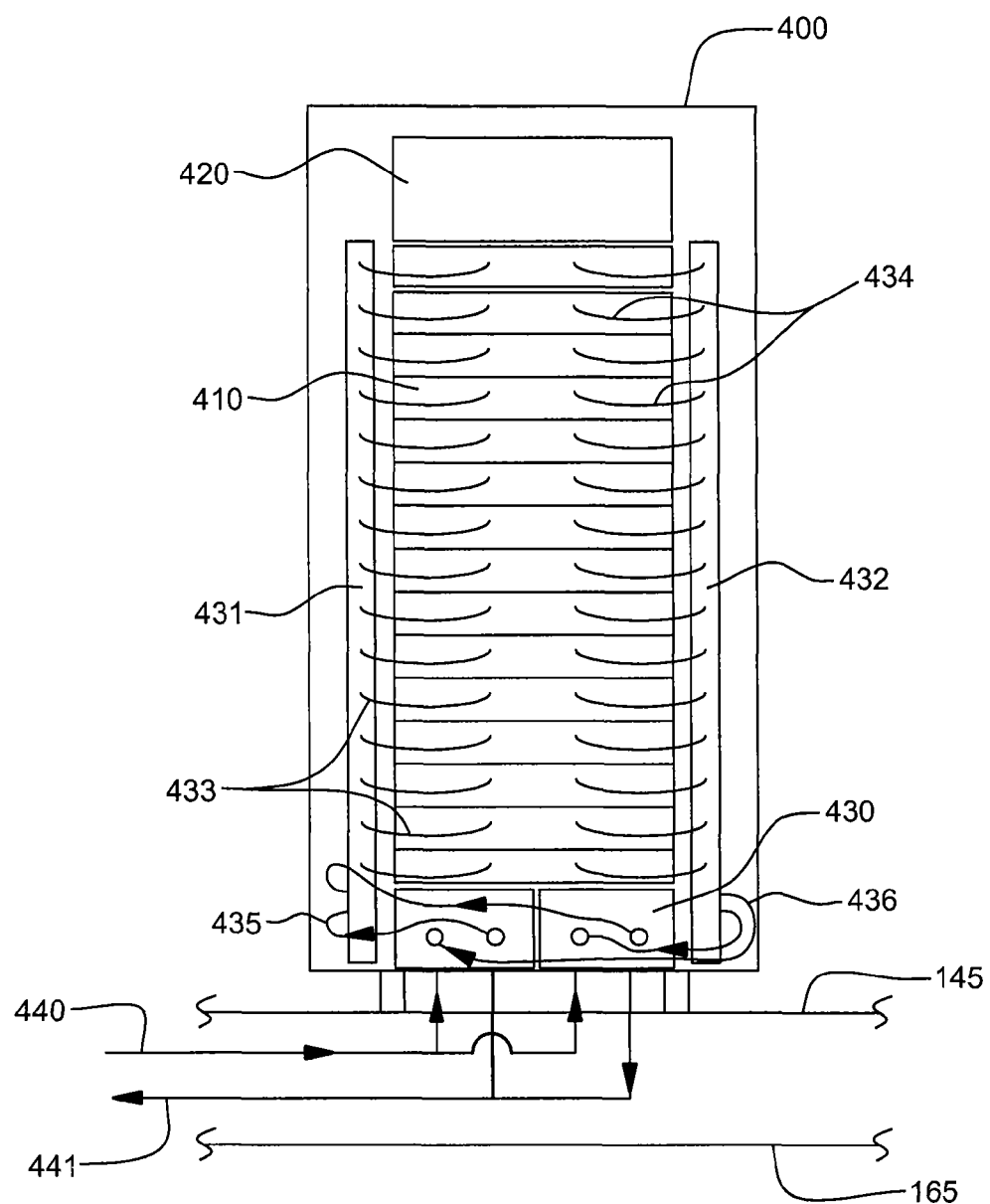
FIG. 4 is a front elevational view of one embodiment of a liquid-cooled electronics rack comprising multiple electronic subsystems cooled by an apparatus, in accordance with an aspect of the present invention.

FIG. 4 depicts one embodiment of a liquid-cooled electronics rack 400 which employs a cooling apparatus to be monitored and operated as described herein. In one embodiment, liquid-cooled electronics rack 400 comprises a plurality of electronic subsystems 410, which are (in one embodiment) processor or server nodes. A bulk power regulator 420 is shown disposed at an upper portion of liquid-cooled electronics rack 400, and two modular cooling units (MCUs) 430 are disposed in a lower portion of the liquid-cooled electronics rack. In the embodiment described below, the coolant is assumed to be water or an aqueous-based solution, again, by way of example only.

In addition to MCUs 430, the cooling apparatus includes a system water supply manifold 431, a system water return manifold 432, and manifold-to-node fluid connect hoses 433 coupling system water supply manifold 431 to electronic subsystems 410, and node-to-manifold fluid connect hoses 434 coupling the individual electronic subsystems 410 to system water return manifold 432. Each MCU 430 is in fluid communication with system water supply manifold 431 via a respective system water supply hose 435, and each MCU 430 is in fluid communication with system water return manifold 432 via a respective system water return hose 436.

As illustrated, heat load of the electronic subsystems is transferred from the system water to cooler facility water supplied by facility water supply line 440 and facility water return line 441 disposed, in the illustrated embodiment, in the space between a raised floor 145 and a base floor 165.

Figure 5:
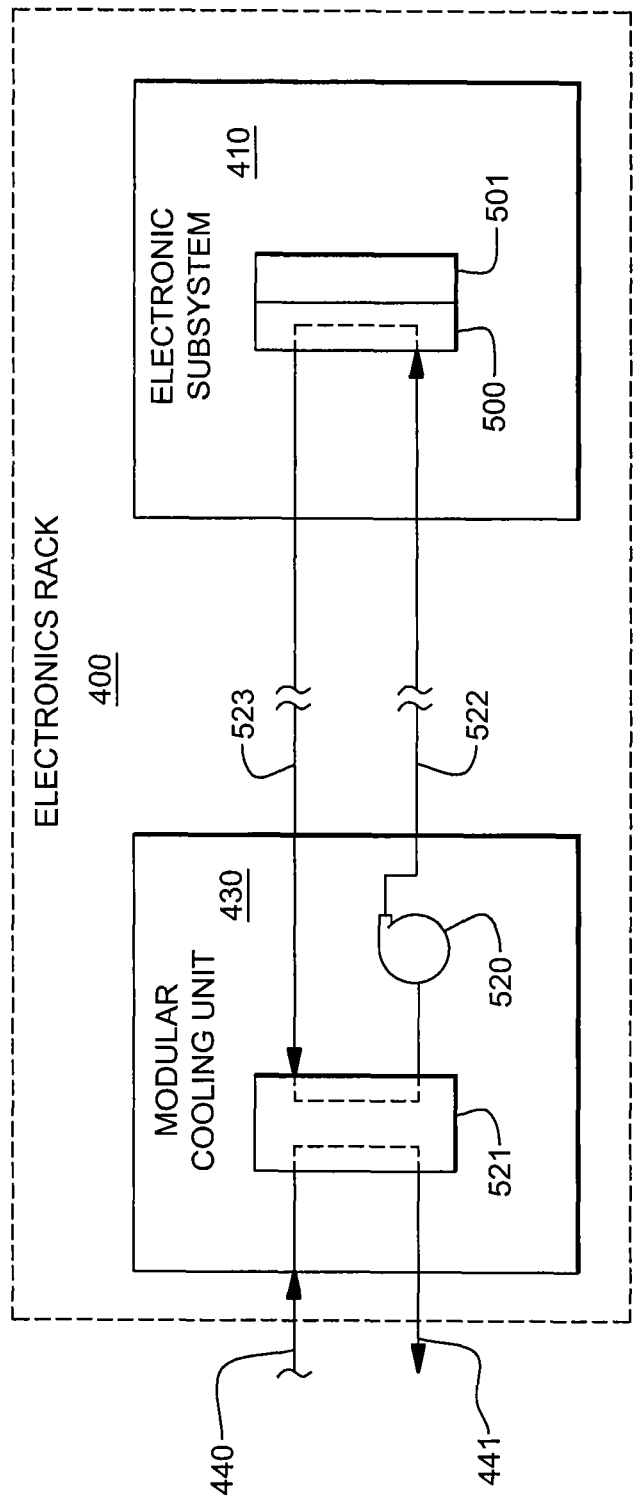
FIG. 5 is a schematic of one embodiment of an electronic subsystem of an electronics rack, wherein an electronic module (or component) is liquid-cooled by system coolant provided by one or more modular cooling units disposed within the electronics rack, in accordance with an aspect of the present invention.

FIG. 5 schematically illustrates operation of the cooling apparatus of FIG. 4, wherein a liquid-cooled cold plate 500 is shown coupled to an electronic module 501 of an electronic subsystem 410 within the liquid-cooled electronics rack 400. Heat is removed from electronic module 501 via the system coolant circulated via pump 520 through cold plate 500 within the system coolant loop defined by liquid-to-liquid heat exchanger 521 of modular cooling unit 430, lines 522, 523 and cold plate 500. The system coolant loop and modular cooling unit are designed to provide coolant of a controlled temperature and pressure, as well as controlled chemistry and cleanliness to cool the electronic module(s). Furthermore, the system coolant is physically separate from the less controlled facility coolant in lines 440, 441, to which heat is ultimately transferred.

Figure 6:
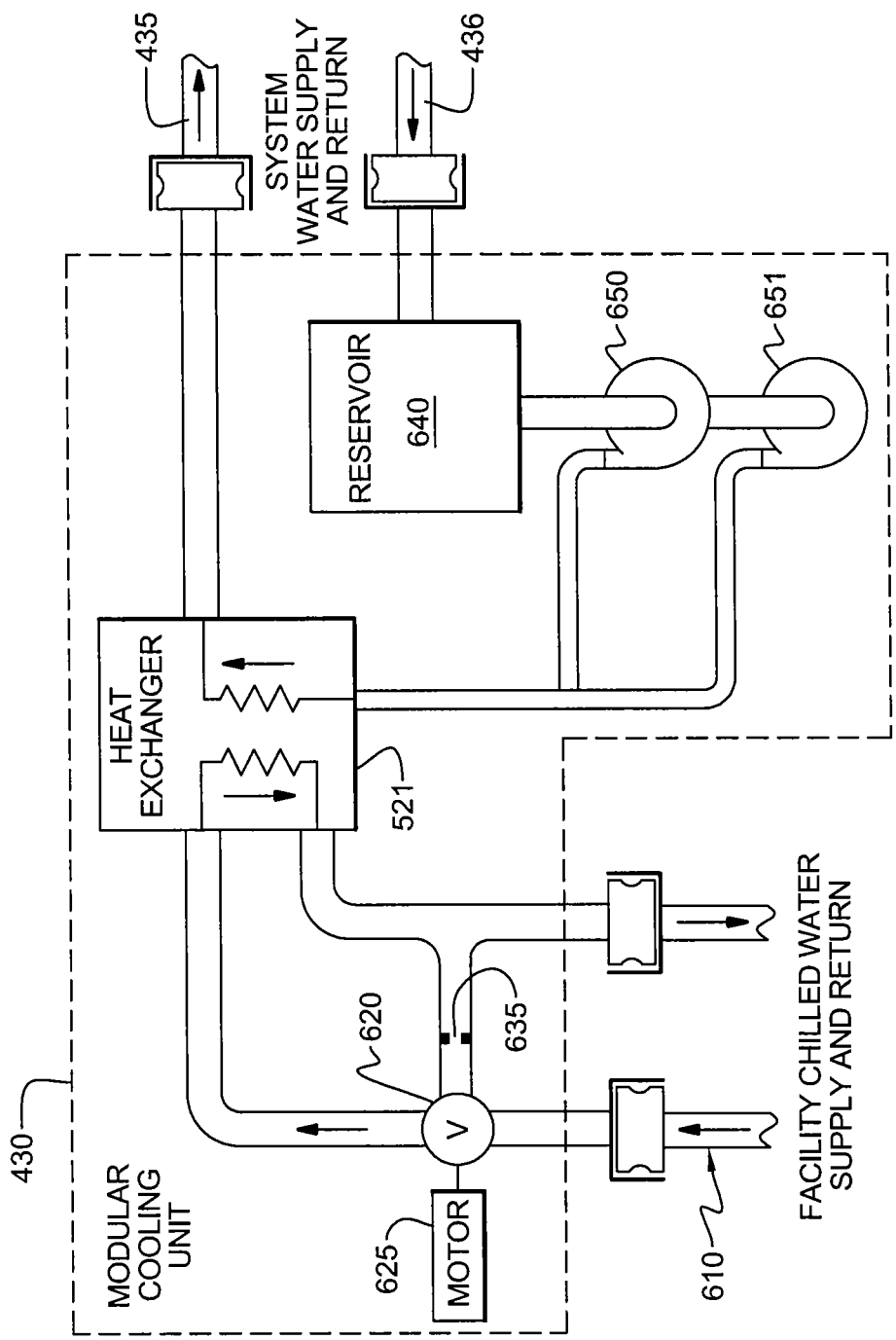
FIG. 6 is a schematic of one embodiment of a modular cooling unit disposed within a liquid-cooled electronics rack, in accordance with an aspect of the present invention.

FIG. 6 depicts a more detailed embodiment of a modular cooling unit 430, in accordance with an aspect of the present invention. As shown in FIG. 6, modular cooling unit 430 includes a first cooling loop wherein building chilled, facility coolant is supplied 610 and passes through a control valve 620 driven by a motor 625. Valve 620 determines an amount of facility coolant to be passed through heat exchanger 521, with a portion of the facility coolant possibly being returned directly via a bypass orifice 635. The modular water cooling unit further includes a second cooling loop with a reservoir tank 640 from which system coolant is pumped, either by pump 650 or pump 651, into the heat exchanger 521 for conditioning and output thereof, as cooled system coolant to the electronics rack to be cooled. The cooled system coolant is supplied to the system water supply manifold and system water return manifold of the liquid-cooled electronics rack via the system water supply hose 435 and system water return hose 436, respectively.

Figure 7:
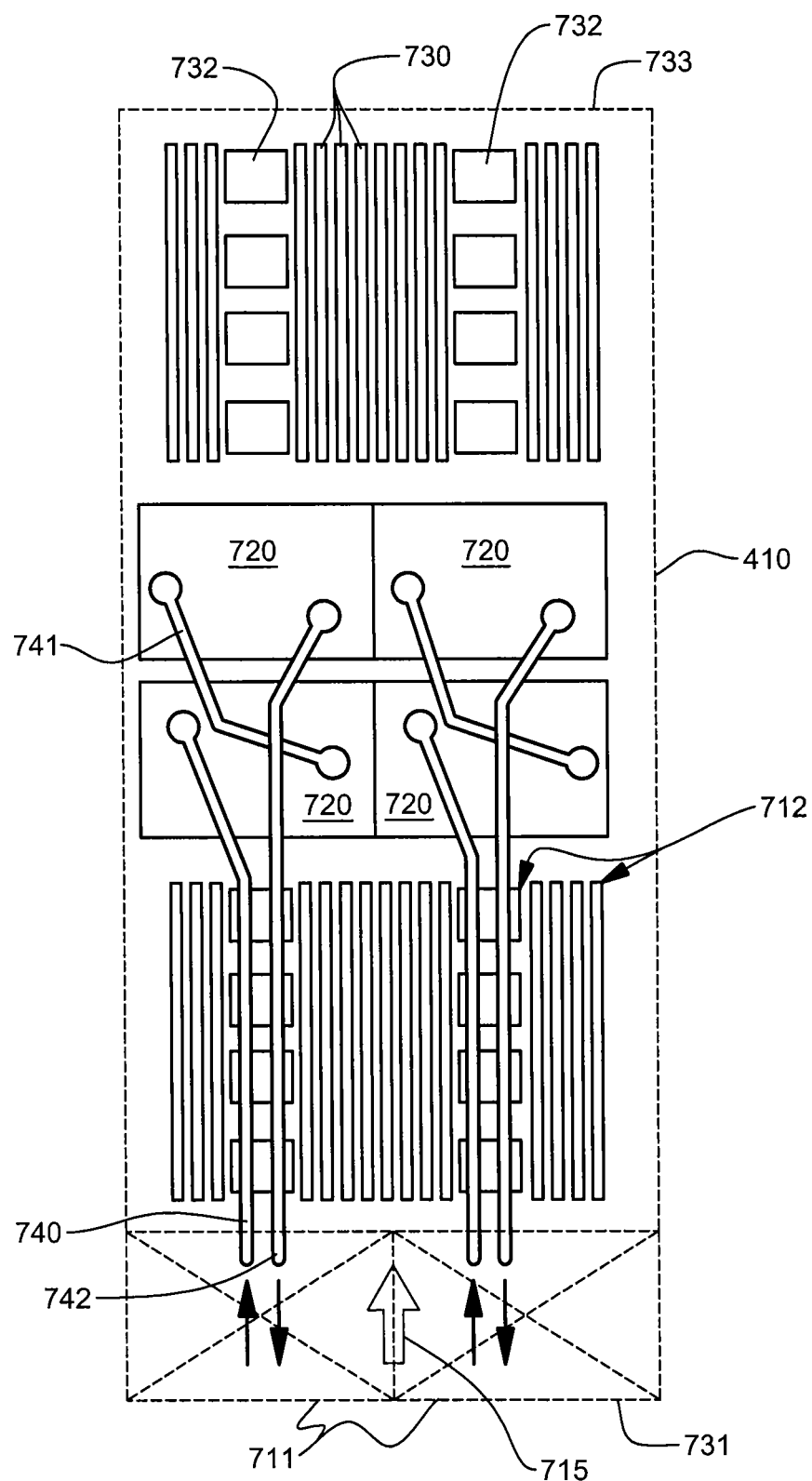
FIG. 7 is a plan view of one embodiment of an electronic subsystem layout illustrating an air and liquid cooling subsystem for cooling components of the electronic subsystem, in accordance with an aspect of the present invention.

FIG. 7 depicts one embodiment of an electronic subsystem 410 component layout wherein one or more air moving devices 711 provide forced air flow 715 to cool multiple components 712 within electronic subsystem 713. Cool air is taken in through a front 731 and exhausted out a back 733 of the drawer. The multiple components to be cooled include multiple processor modules to which liquid-cooled cold plates 720 (of a liquid-based cooling system) are coupled, as well as multiple arrays of memory modules 730 (e.g., dual in-line memory modules (DIMMs)) and multiple rows of memory support modules 732 (e.g., DIMM control modules) to which air-cooled heat sinks are coupled. In the embodiment illustrated, memory modules 730 and the memory support modules 732 are partially arrayed near front 731 of electronic subsystem 410, and partially arrayed near back 733 of electronic subsystem 410. Also, in the embodiment of FIG. 7, memory modules 730 and the memory support modules 732 are cooled by air flow 715 across the electronic subsystem.

The illustrated liquid-based cooling system further includes multiple coolant-carrying tubes connected to and in fluid communication with liquid-cooled cold plates 720. The coolant-carrying tubes comprise sets of coolant-carrying tubes, with each set including (for example) a coolant supply tube 740, a bridge tube 741 and a coolant return tube 742. In this example, each set of tubes provides liquid coolant to a series-connected pair of cold plates 720 (coupled to a pair of processor modules). Coolant flows into a first cold plate of each pair via the coolant supply tube 740 and from the first cold plate to a second cold plate of the pair via bridge tube or line 741, which may or may not be thermally conductive. From the second cold plate of the pair, coolant is returned through the respective coolant return tube 742.

Figure 8:
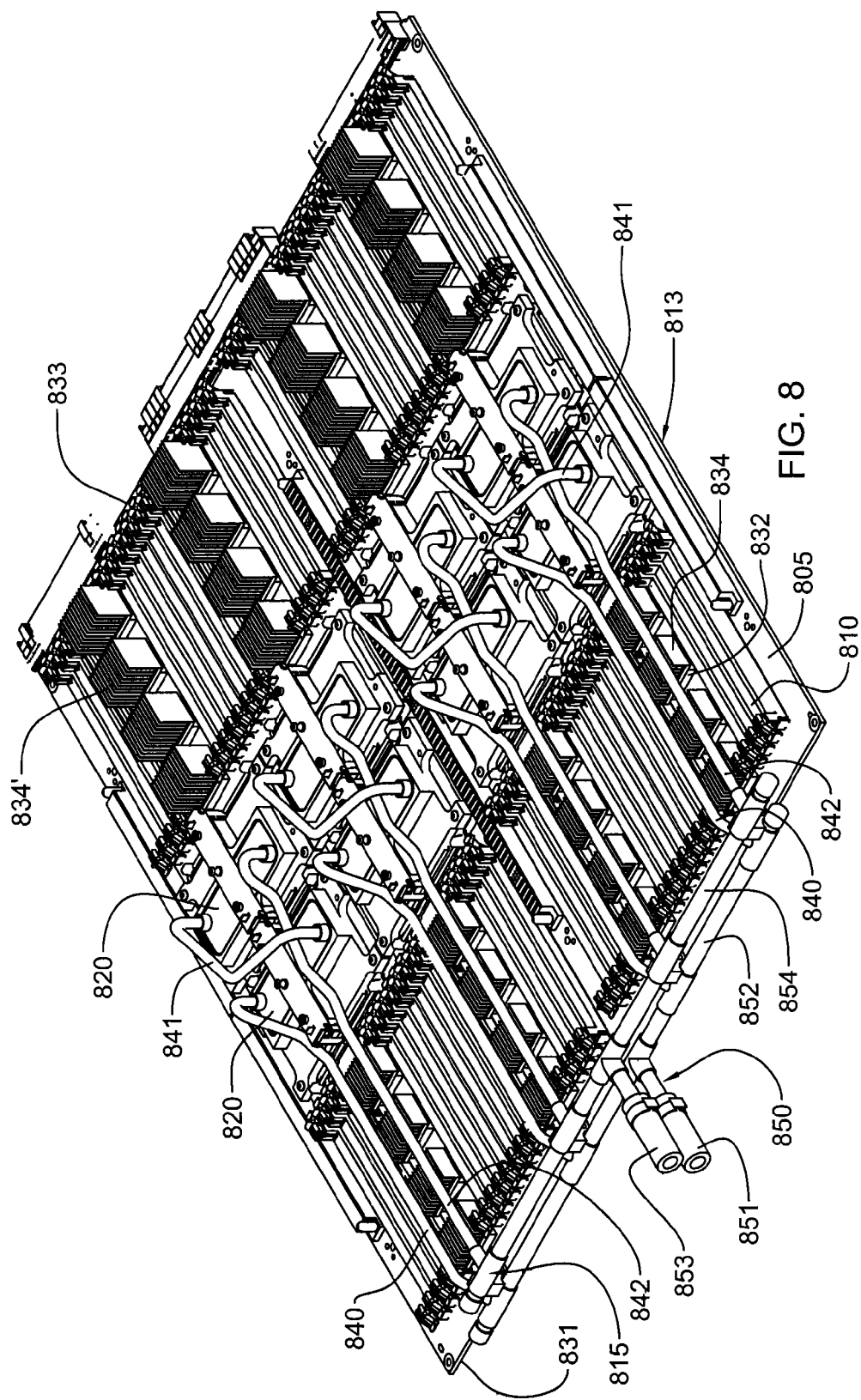
FIG. 8 depicts one detailed embodiment of a partially-assembled electronic subsystem layout, wherein the electronic subsystem includes eight heat-generating electronic components to be actively cooled, each having a respective liquid-cooled cold plate of a liquid-based cooling system coupled thereto, in accordance with an aspect of the present invention.

FIG. 8 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat generating electronic components of an electronic system, and thereby more effectively maintain the components at a desirable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronics system implementation. These more robust cooling systems have unique problems in their assembly and implementation. For example, one assembly solution is to utilize multiple fittings within the electronic system, and use flexible plastic or rubber tubing to connect headers, cold plates, pumps and other components. However, such a solution may not meet a given customer's specifications and need for reliability.

Thus, presented herein in one aspect (and by way of example only) is a robust and reliable liquid-based cooling system specially preconfigured and prefabricated as a monolithic structure for positioning within a particular electronics drawer.

FIG. 8 is an isometric view of one embodiment of an electronic drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 8 depicts a partially assembled electronic system 813 and an assembled liquid-based cooling system 815 coupled to primary heat generating components (e.g., including processor dies) to be cooled. In this embodiment, the electronic system is configured for (or as) an electronic drawer of an electronics rack, and includes, by way of example, a support substrate or planar board 805, a plurality of memory module sockets 810 (with the memory modules (e.g., dual in-line memory modules) not shown), multiple rows of memory support modules 832 (each having coupled thereto an air-cooled heat sink 834), and multiple processor modules (not shown) disposed below the liquid-cooled cold plates 820 of the liquid-based cooling system 815.

In addition to liquid-cooled cold plates 820, liquid-based cooling system 815 includes multiple coolant-carrying tubes, including coolant supply tubes 840 and coolant return tubes 842 in fluid communication with respective liquid-cooled cold plates 820. The coolant-carrying tubes 840, 842 are also connected to a header (or manifold) subassembly 850 which facilitates distribution of liquid coolant to the coolant supply tubes and return of liquid coolant from the coolant return tubes 842. In this embodiment, the air-cooled heat sinks 834 coupled to memory support modules 832 closer to front 831 of electronic drawer 813 are shorter in height than the air-cooled heat sinks 834' coupled to memory support modules 832 near back 833 of electronics drawer 813. This size difference is to accommodate the coolant-carrying tubes 840, 842 since, in this embodiment, the header subassembly 850 is at the front 831 of the electronic drawer and the multiple liquid-cooled cold plates 820 are in the middle of the drawer.

Liquid-based cooling system 815 comprises (in this embodiment) a preconfigured monolithic structure which includes multiple (pre-assembled) liquid-cooled cold plates 820 configured and disposed in spaced relation to engage respective heat generating electronic components. Each liquid-cooled cold plate 820 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 820 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 8, header subassembly 850 includes two liquid manifolds, i.e., a coolant supply header 852 and a coolant return header 854, which in one embodiment, are coupled together via supporting brackets. In the monolithic cooling structure of FIG. 8, the coolant supply header 852 is metallurgically bonded and in fluid communication to each coolant supply tube 840, while the coolant return header 854 is metallurgically bonded and in fluid communication to each coolant return tube 852. A single coolant inlet 851 and a single coolant outlet 853 extend from the header subassembly for coupling to the electronics rack's coolant supply and return manifolds (not shown).

FIG. 8 also depicts one embodiment of the preconfigured, coolant-carrying tubes. In addition to coolant supply tubes 840 and coolant return tubes 842, bridge tubes or lines 841 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 840, bridge tubes 841 and coolant return tubes 842 are each preconfigured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are preconfigured for a particular electronic system to facilitate installation of the monolithic structure in engaging relation with the electronic system.

Liquid cooling of heat-generating electronic components within an electronics rack can greatly facilitate removal of heat generated by those components. However, in certain high performance systems, the heat dissipated by certain components being liquid-cooled, such as processors, may exceed the ability of the liquid cooling system to extract heat. For example, a fully configured liquid-cooled electronics rack, such as described hereinabove may dissipate approximately 72 kW of heat. Half of this heat may be removed by liquid coolant using liquid-cooled cold plates such as described above. The other half of the heat may be dissipated by memory, power supplies, etc., which are air-cooled. Given the density at which electronics racks are placed on a data center floor, existing air-conditioning facilities are stressed with such a high air heat load from the electronics rack. Thus, a solution presented herein is to incorporate one or more air-to-liquid heat exchangers, for example, at the air outlet side of the electronics rack, to extract heat from air egressing from the electronics rack. This solution is presented in combination with liquid-cooled cold plate cooling of certain primary heat-generating components within the electronics rack. To provide redundancy, two MCUs are (in one embodiment) associated with the electronics rack, and system coolant is fed from cooling the liquid-cooled cold plates disposed within the one or more electronic subsystems of the electronics rack to the one or more air-to-liquid heat exchangers.

Also, in accordance with another aspect of the present invention, the cooling apparatus is multimodal, being capable of transitioning between a primary, liquid-cooling mode and a secondary, air-cooling mode. In primary, liquid-cooling mode, the one or more MCUs provide cooled system coolant to liquid cool one or more electronic components (such as processor multichip modules (MCMs)), and provide system coolant to the one or more air-to-liquid heat exchangers for cooling at least a portion of air passing through the electronics rack. In secondary, air-cooling mode, system coolant flows from cooling the one or more electronic components to the one or more air-to-liquid heat exchangers for rejecting, via the system coolant, heat from the one or more electronic components to air passing across the one or more air-to-liquid heat exchangers.

The above-summarized aspects of the invention are described further below with reference to the exemplary embodiment of FIG. 9.

Figure 9:
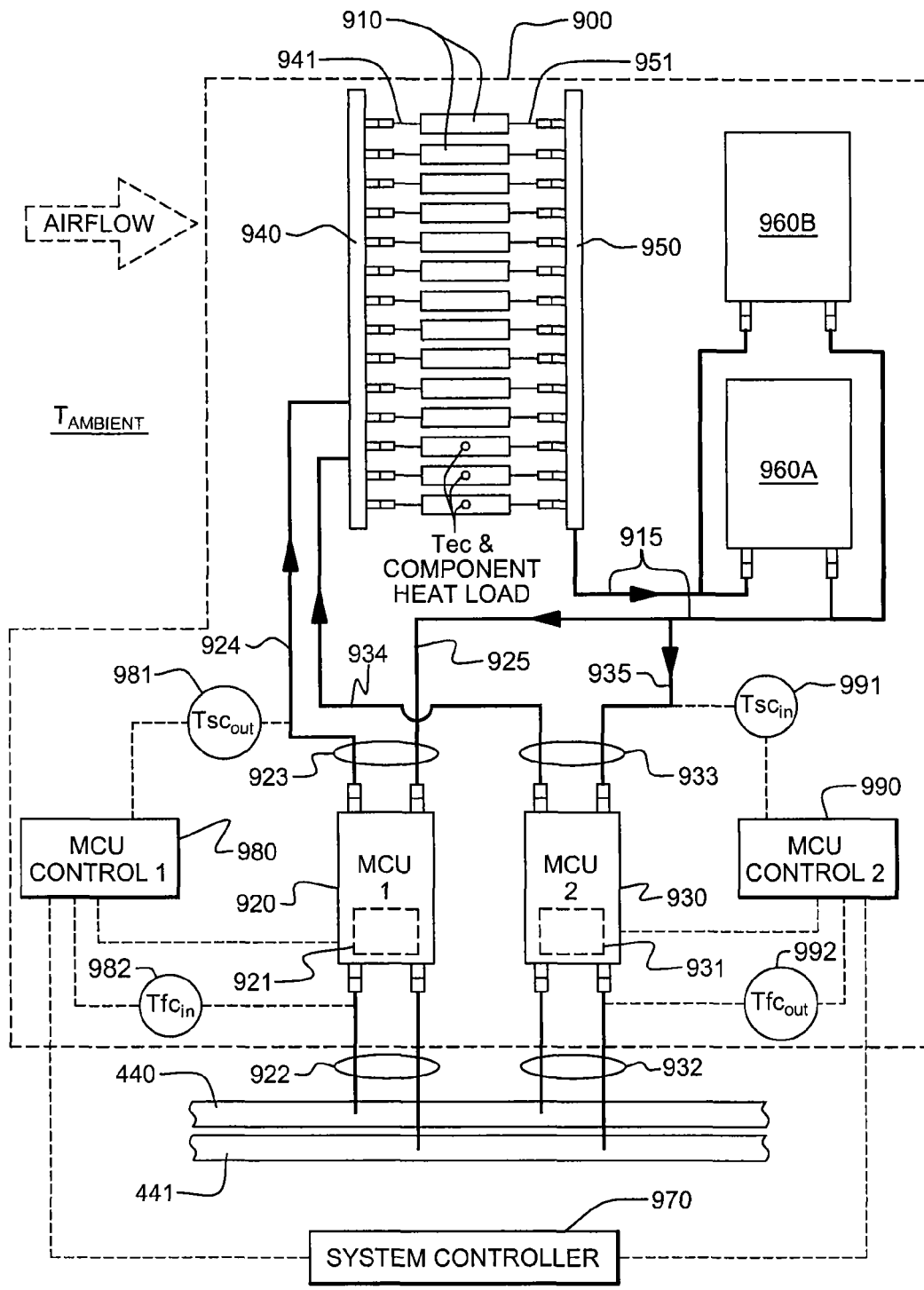
FIG. 9 is a schematic of one embodiment of a cooled electronic system comprising a liquid-cooled electronics rack and a cooling apparatus thereof, wherein the cooling apparatus includes two modular cooling units (MCUs) for providing in parallel liquid coolant to cool selected electronic components (e.g., server units) of the rack, and multiple air-to-liquid heat exchangers disposed, for example, at an air outlet side of the electronics rack for cooling (in a primary, liquid-cooling mode of the cooling apparatus) air egressing therefrom, in accordance with an aspect of the present invention.

FIG. 9 illustrates one embodiment of a cooled electronics system wherein an electronics rack 900 includes a plurality of heat-generating electronic components or subsystems (e.g., processor backs) 910, which are liquid-cooled employing a cooling apparatus comprising one or more modular cooling units (MCUs) 920, 930 (herein labeled MCU 1 & MCU 2, respectively). The MCUs are configured and coupled to provide system coolant in parallel to the plurality of heat-generating electronic components/subsystems for facilitating liquid cooling thereof. Each MCU 920, 930 includes a liquid-to-liquid heat exchanger 921, 931, and a first coolant path 922, 932 and a second coolant path, 923, 933, respectively, passing therethrough. The first coolant paths 922, 932 are coupled to receive (in primary, liquid-cooling mode) chilled facility coolant, via (for example) facility water supply line 440 and facility water return line 441. In primary, liquid-cooling mode, each first coolant path 922, 932 passes at least a portion of the chilled coolant flowing therein through the respective liquid-to-liquid heat exchanger 921, 931, and each second coolant path 923, 933 is coupled to provide cooled system coolant to the plurality of heat-generating electronic components/subsystems 910 of electronics rack 900, and expel heat via the respective liquid-to-liquid heat exchanger 921, 931 from the plurality of heat-generating electronic components/subsystems 910 to the facility coolant passing through the first coolant path 922, 932.

The second coolant paths 923, 933 comprise part of a coolant loop 915 which includes coolant supply lines 924, 934, that supply system coolant from the liquid-to-liquid heat exchangers 921, 931 to a system coolant supply manifold 940 (in one embodiment). System coolant supply manifold 940 is coupled via supply hoses 941 to the plurality of heat-generating electronic subsystems 910 of electronics rack 900 (e.g., using quick connect couplings connected to respective ports of the system coolant supply manifold). In the illustrated embodiment, coolant loop 915 further includes a system coolant return manifold 950 to which system coolant is exhausted from the plurality of heat-generating electronic components/subsystems 910 via return hoses 951 coupling the heat-generating electronic components/subsystems to system coolant return manifold 950. In one embodiment, the return hoses may couple to respective ports of the system coolant return manifold via quick connect couplings. Further, in one embodiment, the plurality of heat-generating electronic components/subsystems each couple to or include a respective liquid-based cooling subsystem, for example, such as described above in connection with FIGS. 7 & 8, which is coupled to supply hoses 941 and return hoses 951 to facilitate liquid cooling of one or more heat-generating electronic components thereof.

In addition to supplying and exhausting system coolant in parallel to the plurality of heat-generating electronic components/subsystems of the electronics rack, the cooling apparatus also provides system coolant in parallel from system coolant return manifold 950 to one or more air-to-liquid heat exchangers. In the embodiment illustrated, two air-to-liquid heat exchanger 960A, 960B are shown coupled in parallel fluid communication between system coolant return manifold 950 and system coolant return lines 925, 935 of the MCUs 920, 930. By way of example, the two air-to-liquid heat exchangers 960A, 960B may both be employed within electronics rack 900 (in one embodiment) to provide redundancy should, for example, servicing of one of the heat exchangers be required. In one example, air-to-liquid heat exchangers 960A, 960B are disposed at the air outlet side of electronics rack 900, wherein external air flows through electronics rack 900 from an air inlet side to the air outlet side thereof. As a further detail, air-to-liquid heat exchangers 960A, 960B could be disposed one atop the other or side-by-side at the air outlet side of the electronics rack. Advantageously, in primary, liquid-cooling mode, air-to-liquid heat exchangers 960A, 960B cool air exhausting from electronics rack 900 to remove heat therefrom before the heat is rejected into the data center. By way of example, air-to-liquid heat exchangers 960A, 960B may be sized to cool substantially all air egressing from electronics rack 900, and thereby reduce air-conditioning requirements within the data center containing the electronics rack. In one operational example, the multiple air-to-liquid heat exchangers may be configured to remove 50%-70% of the heat from the air exhausting from the electronics rack prior to the hot exhaust air entering the data center. Further, in one example, a plurality of electronics racks in the data center may each be provided with a cooling apparatus such as described herein and depicted in FIG. 9.

In the embodiment of FIG. 9, system coolant flows to and from air-to-liquid heat exchangers 960A, 960B via coolant loop 915. Quick connect couplings may be employed at the inlet and outlet of the air-to-liquid heat exchangers 960A, 960B and/or at corresponding ports at the system coolant return manifold and the MCUs to facilitate connection of the coolant loop therebetween. In one embodiment, each MCU of the two MCUs illustrated is configured and sized to function within required design parameters as a primary MCU (with the other MCU being a backup MCU) to extract the full heat load from both the plurality of heat-generating electronic components/subsystems and the air-to-liquid heat exchangers. Therefore, the two MCUs 920, 930 may be functioning in primary, liquid-cooling mode either in parallel, or as primary and backup cooling units. Two (or more) MCUs ensures a measure of redundancy to the cooling system.

As shown, the cooling system further includes a system controller 970, and an MCU control 1 980 and an MCU control 2 990, which (in one embodiment) cooperate together to monitor system coolant temperature out ($Tsc_{out}$) to the heat-generating electronic components (i.e., to the liquid-cooled cold plates coupled to the heat-generating components), system coolant temperature in ($Tsc_{in}$) from the one or more air-to-liquid heat exchangers, facility coolant temperature in ($Tfc_{in}$) to the MCUs, and facility coolant temperature out ($Tfc_{out}$) from the MCUs to facilitate intelligent transitioning of the cooling apparatus between primary, liquid-cooling mode, and secondary, air-cooling mode, as described further below.

In the embodiment shown, system controller 970 is coupled to both MCU control 1 and MCU control 2, wherein MCU control 1 980 monitors system coolant temperature out ($Tsc_{out}$), and facility coolant temperature in ($Tfc_{in}$), while MCU control 2 990 monitors system coolant temperature in ($Tsc_{in}$) to the MCUs and facility coolant temperature out ($Tfc_{out}$) from the MCUs, by way of example only. In an alternate embodiment, each MCU control could monitor system coolant temperatures in and out and facility coolant temperatures in and out by coupling to appropriate temperature sensors disposed to sense the respective coolant temperature. Further, in an alternate embodiment, one or more flow control meters could be associated with, for example, each first coolant path 922, 932 for automatically monitoring flow of facility coolant through the respective MCU to, for example, facilitate determining whether to operate the cooling apparatus in primary, liquid-cooling mode or secondary, air-cooling mode.

Additionally, system controller 970 is coupled to monitor, for example, ambient air temperature ($T_{ambient}$), electronic component temperature (Tec), as well as ascertain electronic component heat load. By way of example, electronic component heat load can be ascertained by determining power usage of the component, and by knowing the configuration of the electronics rack, a total electronic component heat load may be determined. From this information, temperature of air entering the air-to-liquid heat exchangers at the air outlet side of the electronics rack may be estimated and, as described below in connection with FIG. 11, these values may be used to adjust the cooling mode, as well as operational speed of one or more air-moving devices within the electronics rack, and/or to adjust speed of a clock provided to the electronic component (e.g., processor) and/or to adjust facility coolant flow through the respective liquid-to-liquid heat exchangers of the cooling units (e.g., the MCUs). By way of specific example, temperature of air entering the air-to-liquid heat exchangers at the air outlet side of the electronics rack may be determined by multiplying a constant by the total electronic component heat load less heat load removed by the cold plates, and dividing that product by the rack airflow rate. To the resultant value, which is the temperature rise of air in the rack, the inlet ambient temperature is added.

As noted, the cooling apparatus depicted in FIG. 9 is multimodal. In primary, liquid-cooling mode, the one or more cooling units (e.g., MCUs 920, 930) provide cooled system coolant to cool one or more electronic components (e.g., of heat-generating electronic subsystems 910), and the system coolant is subsequently provided to one or more air-to-liquid heat exchangers (e.g., air-to-liquid heat exchangers 960A, 960B) for cooling at least a portion of air passing through the electronics rack 900. Heat extracted by the system coolant is transferred in the primary, liquid-cooling mode to the facility chilled coolant. Note that in this mode, system coolant flow to the electronic components is in parallel, and serially thereafter, system coolant flow to the multiple air-to-liquid heat exchangers is also in parallel. This flow arrangement advantageously allows for a lowest temperature coolant to all of the electronic components in the system, as well as provides redundancy, for example, for servicing one or more of the electronic components or one or more of the air-to-liquid heat exchangers. This also translates into a lowest possible electronic component temperature within the electronic subsystems, as well as a desired amount of heat removal from air flowing through the electronics rack via the air-to-liquid heat exchangers.

In the secondary, air-cooling mode, system coolant flows from cooling the one or more electronic components to the one or more air-to-liquid heat exchangers for rejecting heat from the electronic components to air passing across the air-to-liquid heat exchangers. In this mode, the cooling apparatus may be operated without any facility chilled coolant being provided. For example, this mode could advantageously be employed prior to operative connection of the facility chilled coolant to the modular cooling units, or in the event of failure of facility coolant cooling to the modular cooling units, either in terms of coolant temperature or flow.

Figure 10:
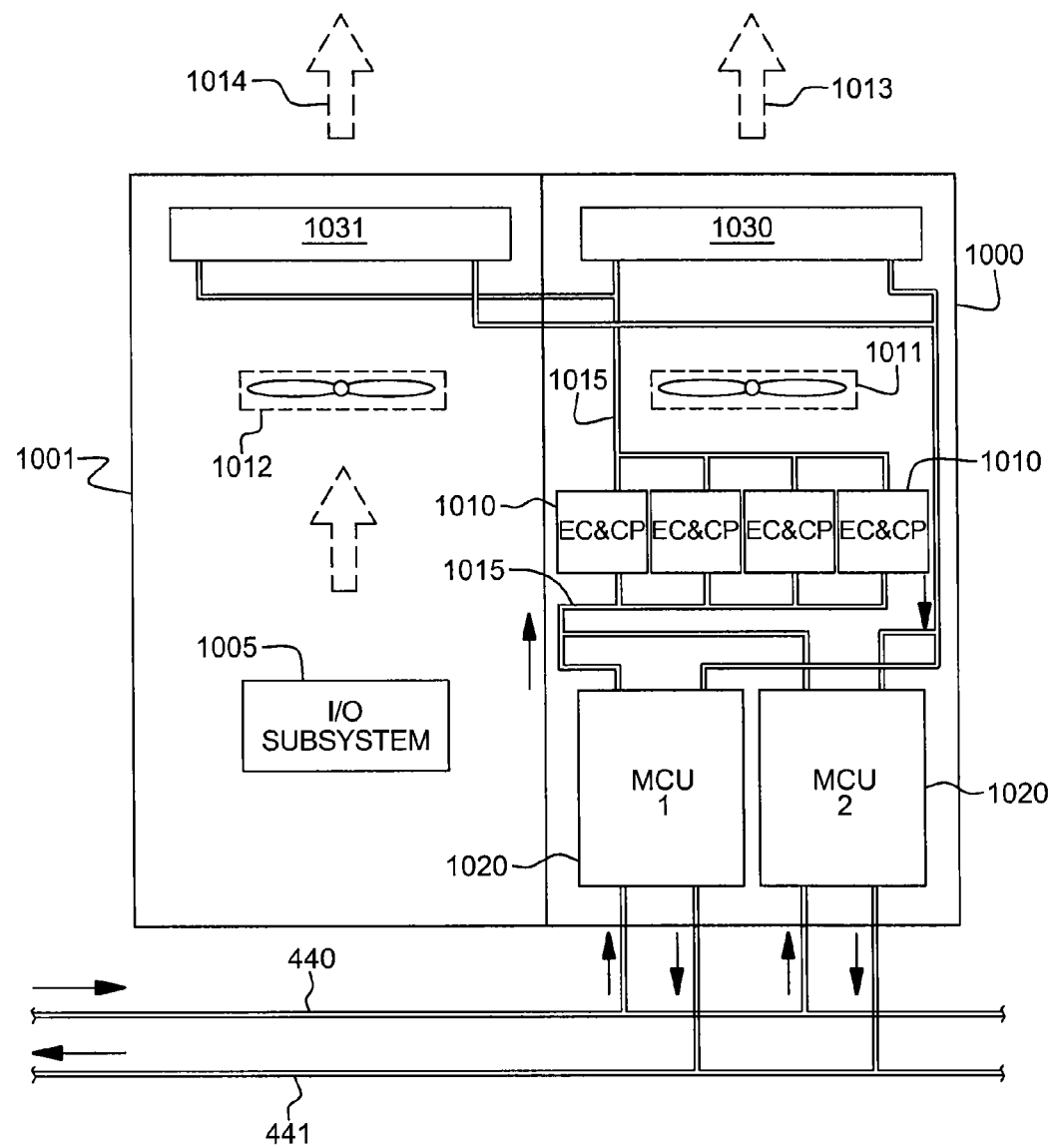
FIG. 10 is a schematic of another embodiment of a cooled electronic system comprising adjacent liquid-cooled electronics racks and a cooling apparatus thereof, in accordance with an aspect of the present invention.

FIG. 10 depicts an alternate implementation of a cooled electronic system comprising an electronics rack 1000 and an adjacent electronics rack 1001, and employing a cooling apparatus, in accordance with an aspect of the present invention. In this implementation, multiple heat-generating electronic components (EC), such as processor multichip modules (MCMs), each have a liquid-cooled cold plate (CP) coupled thereto 1010. Four such high heat-generating electronic components and cold plates (EC & CP) 1010 are illustrated by way of example only in the embodiment of FIG. 10. More or less high heat-generating electronic components and associated cold plates could be coupled in parallel within a cooling apparatus, in accordance with an aspect of the present invention. Additionally, in the absence of one or more heat-generating electronic components, an impedance matching blank (not shown) could be substituted for the illustrated heat-generating electronic component and cold plate (EC & CP) combination. In one embodiment, a constant system coolant flow is provided through the coolant loop irrespective of the number of high-heat-generating electronic components currently in the configuration and irrespective of the mode of operation of the cooling apparatus. The use of impedance matching blanks within the cooling loop facilitates achieving such a constant system coolant flow.

In the embodiment of FIG. 10, the cooling apparatus includes multiple cooling units 1020, labeled MCU 1 and MCU 2. The cooling units are coupled in parallel to receive facility chilled coolant, such as building chilled water, which is passed through the cooling units via appropriate independent connections to (for example) facility water supply line 440 and facility water return line 441, to provide, via a coolant loop 1015, system coolant to cool the multiple electronic components and cold plates (EC & CP) 1010 in parallel. Each cooling unit includes a liquid-to-liquid heat exchanger, a first coolant path and a second coolant path. As described above, the first coolant path of each cooling unit receives, in primary, liquid-cooling mode, chilled facility coolant and passes at least a portion thereof through the liquid-to-liquid heat exchanger, and the second coolant path, coupled in fluid communication with the coolant loop 1015, provides system coolant to cool the one or more electronic components, and in primary, liquid-cooling mode, expels heat in the liquid-to-liquid heat exchanger from system coolant in the second coolant path to facility coolant in the first coolant path.

Effluent from the liquid-cooled cold plates flows via coolant loop 1015 to multiple heat exchangers 1030, 1031 coupled to coolant loop 1015 in parallel fluid communication. In this example, the air-to-liquid heat exchangers 1030, 1031 are disposed at the air outlet side of electronics rack 1000 and the air outlet side of another electronics rack 1001, respectively, for cooling at least a portion of air passing through the respective rack unit. As shown, each heat exchanger is coupled to coolant loop 1015 to receive system coolant from the loop and exhaust system coolant back to the loop. In primary, liquid-cooling mode, the air-to-liquid heat exchangers 1030, 1031 advantageously remove a significant portion of heat from the air 1013, 1014 egressing from the respective rack 1000, 1001 (e.g., 50%-70% of the heat is removed). In secondary, air-cooling mode, the multiple air-to-liquid heat exchangers advantageously facilitate cooling the multiple electronic components by dissipating heat, via the system coolant, from the electronic components to air passing across the respective air-to-liquid heat exchangers. As one specific example, electronics rack 1000 may comprise a central electronic complex (CEC) frame which comprises a set of hardware that defines a mainframe, and includes, for example, processors, memory, channels, controllers and power supplies, while adjacent electronics rack 1001 may comprise an input/output (I/O) frame comprising one or more input/output subsystems 1005 for the CEC frame. Each electronics rack includes one or more air-moving devices 1011, 1012, which facilitates airflow through the respective rack from an air inlet side to an air outlet side thereof. In one embodiment, the cooling apparatus includes a controller coupled to control operational speed of air-moving devices 1011, 1012, as well as speed of a clock provided to the electronic components, and facility coolant flow (e.g., via flow control valves (not shown)) through the respective cooling units 1020.

By way of example, Table 1 below illustrates various operational conditions for certain parameters of such a cooling apparatus and electronics rack configuration when the apparatus is in primary, liquid-cooling mode, and in secondary, air-cooling mode.

In the second column of Table 1, primary, liquid-cooling mode of the cooling apparatus is again assumed, only with a warmer facility coolant supply, for example, in the range of 19-28° C. In such a case, the processor heat load to coolant removal might be expected to drop to 40%, and the typical system coolant temperature to the processors might rise to 30° C. The processor clock speed still operates at normal level, and the CEC frame and I/O frame fans operate at the slower operational speed.

In the two right-most columns of Table 1, secondary, air-cooling mode of the cooling apparatus is assumed, with no facility coolant being available. In such a case, air-cooling only is provided by the cooling apparatus with the typical system coolant temperature to the processors rising to 40-45° C. in the case of heat dissipation using both air-to-liquid heat exchangers in the two frames, while in the rightmost column, it is assumed that one of the heat exchangers is open, (e.g., in a service mode) and the system coolant temperature of the processors has risen to 45-50° C. In the third column, secondary, air-cooling mode is illustrated wherein the processor clock speed is adjusted to a slower speed (slow 1) (e.g., using "cycle steering") and the fans in the CEC frame and I/O frame have been moved to "faster". By way of example, a faster fan speed might be 1.5 to 1.8 times that of the "slow" fan speed. In the case of secondary, air-cooling mode, with no facility

TABLE 1

|  | Primary, Liquid-Cooling Mode w/ Facility Coolant Cooling | Primary, Liquid-Cooling Mode w/ Warmer Facility Coolant | Secondary, Air-Cooling Mode w/ No Facility Coolant | Secondary, Air-Cooling Mode w/No Facility Coolant and I/O Frame Heat Exchanger Open (in service mode) |
|---|---|---|---|---|
| $Tfc_{in}$ | 4-18° C. | 19-28° C. | N/A | N/A |
| System Heat Load to Facility Coolant - typical | 75% | 40% | None | None |
| Typical $Tsc_{out}$ to processors | 20° C. | 30° C. | 40-45° C. | 45-50° C. |
| Processor clock speed | Normal (or possibly turbo) | Normal | Slow 1 | Slow 1 |
| CEC Frame fan(s) speed | Slow | Slow | Faster | Fastest |
| I/O Frame fan(s) speed | Slow | Slow | Faster | Slow |

In the first, left-most column, the apparatus is in primary, liquid-cooling mode, and temperature of facility coolant into the modular cooling units ($Tfc_{in}$) is in a normal range, for example, 4-18° C. Given this, a typical system coolant output temperature ($Tsc_{out}$) from the modular cooling units to the processors (i.e., one example of the electronic components) might be approximately 20° C. In this mode, 75% of the processor heat load might be removed by the system coolant for rejecting to the facility coolant via the cooling units. Processor clock speed is set normal (or possibly to turbo speed), and the air-moving devices (or fans) within the first frame (e.g., CEC frame) and the second frame (e.g., I/O frame) are each operated at a "slow" speed. By way of example, slow fan speed might be 1 CFM for every 10 watts of heat load rejected to the air passing through the rack. In this mode, heat extracted from the processors and the air passing through the electronics rack is rejected to the chilled facility coolant flowing through the cooling units. Note that operating the fans at slower operational speed advantageously allows for greater heat removal from the air exhausting across the air-to-liquid heat exchangers at the air outlet sides of the adjacent electronics racks (i.e., for the CEC frame and the I/O frame in the example of FIG. 10).

coolant, and with the I/O frame heat exchange frame open for servicing, the fan speed in the CEC frame is operated at an even faster rate, for example, 2 times the "slow" fan speed, while the fan speed in the I/O frame is moved down to the slow speed, so as not to interfere with servicing of the I/O frame. Those skilled in the art should note that a faster fan speed facilitates cooling the system coolant exiting the heat exchangers if no facility coolant cooling is available, while a slower fan speed is optimal for noise reduction, as well as power reduction and removal of heat from egressing air to facility coolant, the facility coolant is available.

Figure 11:
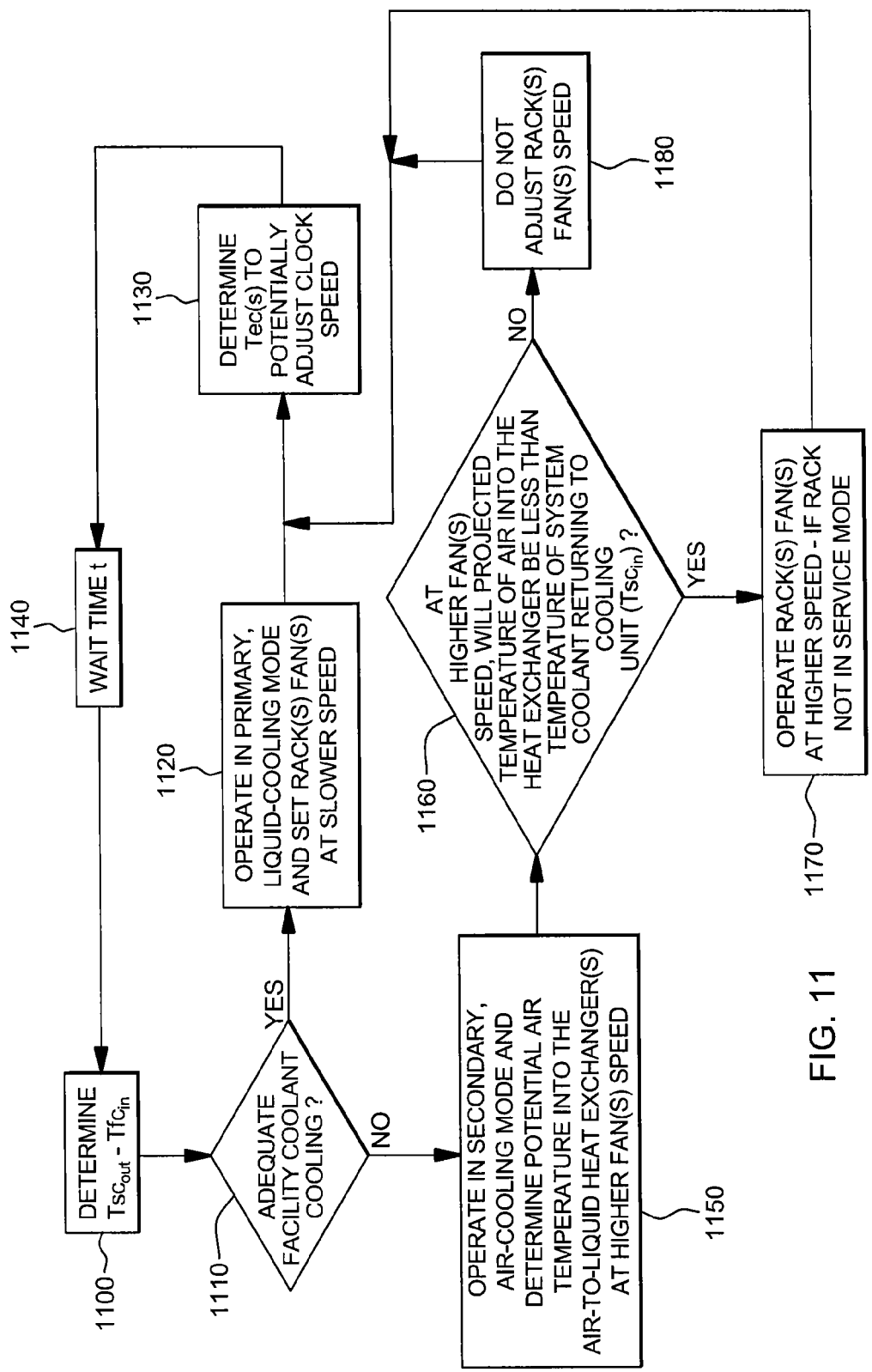
FIG. 11 depicts one embodiment of processing for controlling cooling mode of (for example) the cooling apparatus of FIG. 9 or the cooling apparatus of FIG. 10, between a primary, liquid-cooling mode, and a secondary, air-cooling mode, in accordance with an aspect of the present invention.

FIG. 11 depicts one embodiment of a control process for a cooled electronic system comprising one or more electronics racks and a cooling apparatus, such as described above in connection with the embodiments of FIGS. 9 & 11. Note in this regard that the embodiment of FIG. 10 would include a system controller which monitors and controls the parameters described herein, for example, in a similar manner to that described above in connection with FIG. 9. In the example of FIG. 11, the temperature differential between the system coolant output ($Tsc_{out}$) from the one or more cooling units and the facility coolant flowing into ($Tfc_{in}$) the cooling units is determined 1100 to ascertain whether to operate the cooling apparatus in primary, liquid-cooling mode or secondary, air-cooling mode. Processing determines whether adequate facility coolant cooling is available 1110. Note that in alternate embodiments, one or more other readings could also or alternately be employed by the controller in diagnosing the availability of sufficient facility coolant cooling, including one or more flow meter readings of facility coolant flow through the respective cooling units. Assuming that adequate facility coolant cooling is available (both in terms of temperature and flow), the cooling apparatus is operated in primary, liquid-cooling mode, and the rack fans are set to a slower speed 1120. As noted, and by way of example only, the slower speed might comprise 1 CFM/10 watts of heat load dissipated to air (wherein CFM means cubic feet per minute of airflow). Processing also ascertains the temperature of the electronic component (e.g., processor module) being liquid-cooled to facilitate setting a clock speed for the component 1130, after which processing waits a time t 1140 before again determining the temperature differential between system coolant output from and facility coolant input to the one or more cooling units 1100.

If adequate facility coolant cooling is unavailable, then the cooling apparatus is operated in secondary, air-cooling mode, and processing determines potential air temperature into the air-to-liquid heat exchanger(s) at higher fan(s) speed 1150. At higher fan speed, processing determines whether the projected temperature of air into the heat exchanger(s) will be less than temperature of system coolant returning to the cooling unit ($Tsc_{in}$) 1160 from the heat exchanger(s). If "yes", then the rack fans are operated at the higher speed 1170, that is, assuming that the rack is not currently in service mode. After adjusting the rack fan speed, processing determines temperature of the electronic component in order to potentially adjust clock speed to the component 1130, after which processing waits time t 1140 before looping back to ascertain the temperature differential between system coolant output from and facility coolant input to the cooling units.

If the projected temperature of air into the heat exchanger(s) is not less than the temperature of the system coolant being returned to the cooling units, then the rack fan speeds are not adjusted 1180, since it would not facilitate cooling of the system coolant in the secondary, air-cooling mode. After this, processing determines temperature of the electronic component and sets an appropriate clock speed 1130, after which processing waits time t before again determining the temperature differential between system coolant output and facility coolant input to the cooling units.

Those skilled in the art should note from the above description, that provided herein is a multimodal cooling apparatus capable of transitioning between a primary, liquid-cooling mode and a secondary, air-cooling mode. In primary, liquid-cooling mode, one or more cooling units provide cooled system coolant to liquid cool one or more electronic components of the electronics rack, and provide system coolant to one or more air-to-liquid heat exchangers for cooling at least a portion of the air passing through the electronics rack. In secondary, air-cooling mode, system coolant flows from cooling the one or more electronic components to the one or more air-to-liquid heat exchangers for rejecting, via the system coolant, heat from the one or more electronic components to air passing across the one or more air-to-liquid heat exchangers.

As a specific example, the system coolant and the facility coolant may each comprise water, and even with a total loss of chilled facility coolant to the cooling units, the cooling apparatus will continue to operate, with the total heat load being rejected to the air exhausting at the air outlet side of the electronics rack, and in the embodiment of FIG. 10, at the air outlet side of an adjacent electronics rack. Advantageously, 70+% of the heat load in primary, liquid-cooling mode bypasses the computer room air-conditioning units, and significant reduction in energy use is achieved. Providing the secondary, air-cooling mode provides greater robustness to the system, and there is an automatic transitioning between modes, based on availability of facility coolant cooling. Further, an ability to concurrently replace and maintain either air-to-liquid heat exchanger in either the primary, liquid-cooling mode or the secondary, air-cooling mode is achieved.

As further enhancements, altitude (absolute pressure) sensors could be employed to further adjust air-moving device power by tuning the RPMs to the altitude of the electronics rack. Additionally, the cooling apparatus could be configured to protect itself from high (above specification) dew point conditions using inlet side humidity sensors.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable signal medium may include a propagated data signal with computer readable program code embodied therein, for example, in baseband or as part of a carrier wave. Such a propagated signal may take any of a variety of forms, including, but not limited to, electromagnetic, optical or any suitable combination thereof. A computer readable signal medium may be any computer readable medium that is not a computer readable storage medium and that can communicate, propagate, or transport a program for use by or in connection with an instruction execution system, apparatus or device.

A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 12:
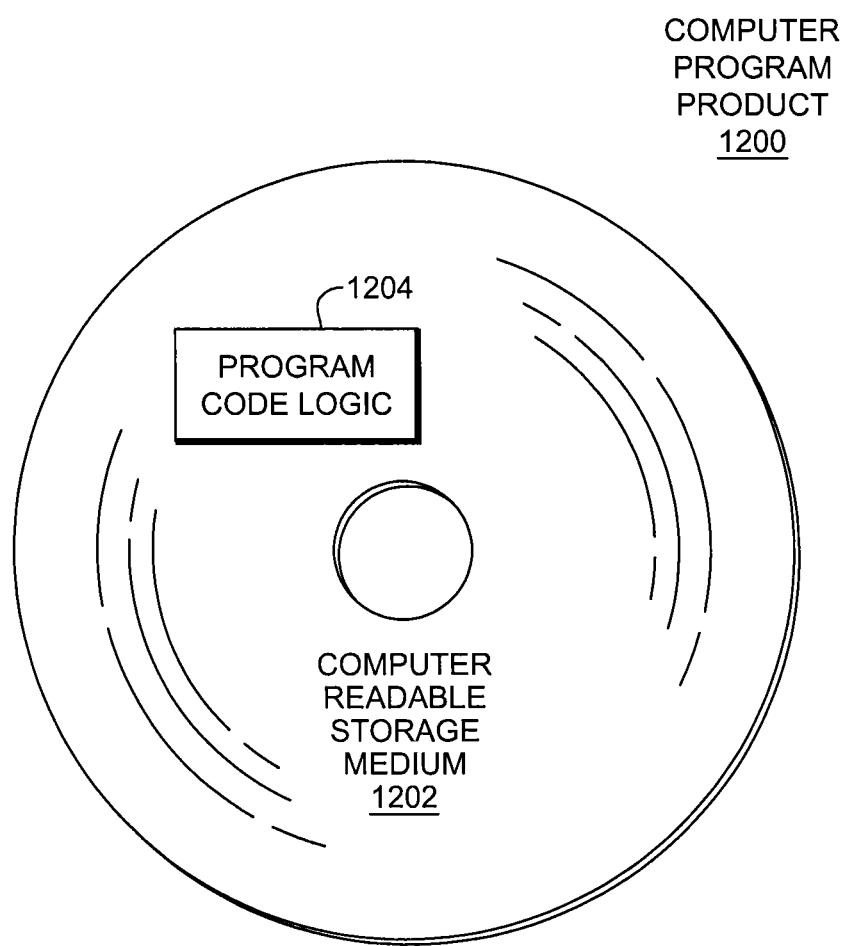
FIG. 12 depicts one embodiment of a computer program product incorporating one or more aspects of the present invention.

Referring now to FIG. 12, in one example, a computer program product 1200 includes, for instance, one or more computer readable storage media 1202 to store computer readable program code means or logic 1204 thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. For example, computing environments of other architectures can incorporate and use one or more aspects of the present invention. Additionally, the network of nodes can include additional nodes, and the nodes can be the same or different from those described herein. Also, many types of communications interfaces may be used. Further, other types of programs and/or other optimization programs may benefit from one or more aspects of the present invention, and other resource assignment tasks may be represented. Resource assignment tasks include the assignment of physical resources. Moreover, although in one example, the partitioning minimizes communication costs and convergence time, in other embodiments, the cost and/or convergence time may be otherwise reduced, lessened, or decreased.

Further, other types of computing environments can benefit from one or more aspects of the present invention. As an example, an environment may include an emulator (e.g., software or other emulation mechanisms), in which a particular architecture (including, for instance, instruction execution, architected functions, such as address translation, and architected registers) or a subset thereof is emulated (e.g., on a native computer system having a processor and memory). In such an environment, one or more emulation functions of the emulator can implement one or more aspects of the present invention, even though a computer executing the emulator may have a different architecture than the capabilities being emulated. As one example, in emulation mode, the specific instruction or operation being emulated is decoded, and an appropriate emulation function is built to implement the individual instruction or operation.

In an emulation environment, a host computer includes, for instance, a memory to store instructions and data; an instruction fetch unit to fetch instructions from memory and to optionally, provide local buffering for the fetched instruction; an instruction decode unit to receive the fetched instructions and to determine the type of instructions that have been fetched; and an instruction execution unit to execute the instructions. Execution may include loading data into a register from memory; storing data back to memory from a register; or performing some type of arithmetic or logical operation, as determined by the decode unit. In one example, each unit is implemented in software. For instance, the operations being performed by the units are implemented as one or more subroutines within emulator software.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiment with various modifications as are suited to the particular use contemplated.

What is claimed is:

1. A cooling apparatus for facilitating cooling of an electronic system comprising at least one electronic component, the cooling apparatus comprising:

at least one cooling unit providing, via a coolant loop, system coolant to cool the at least one electronic component, wherein each cooling unit of the at least one cooling unit comprises a liquid-to-liquid heat exchanger, a first coolant path and a second coolant path, the first coolant path of each cooling unit of the at least one cooling unit receiving, in a primary, liquid-cooling mode, facility coolant from a source and passing at least a portion thereof through the liquid-to-liquid heat exchanger, and the second coolant path being coupled in fluid communication with the coolant loop, and providing system coolant to cool the at least one electronic component, and in primary, liquid-cooling mode, expelling heat in the liquid-to-liquid heat exchanger from system coolant in the second coolant path to facility coolant in the first coolant path;

at least one air-to-liquid heat exchanger cooling, in primary, liquid-cooling mode, air exhausting from the electronic system, the at least one air-to-liquid heat exchanger being coupled to the coolant loop to receive system coolant therefrom and exhaust system coolant thereto, wherein the at least one air-to-liquid heat exchanger is coupled to the coolant loop downstream of cooling the at least one electronic component, and in a secondary, air-cooling mode, the at least one air-to-liquid heat exchanger facilitates cooling the at least one electronic component;

a controller to transition the cooling apparatus between the primary, liquid-cooling mode and the secondary, air-cooling mode, wherein in primary, liquid-cooling mode, the at least one cooling unit provides cooled system coolant to cool the at least one electronic component, and provides system coolant to the at least one air-to-liquid heat exchanger to cool the air exhausting from the electronic system, and in secondary, air-cooling mode, system coolant flows from cooling the at least one electronic component to the at least one air-to-liquid heat exchanger for rejecting, via the system coolant, heat from the at least one electronic component to air passing across the at least one air-to-liquid heat exchanger; and wherein the electronic system comprises an air inlet side and an air outlet side for respectively enabling ingress and egress of external air through the electronic system, the at least one air-to-liquid heat exchanger being disposed adjacent to the air outlet side of the electronic system and cooling, in the primary, liquid cooling mode, the air exhausting from the electronic system at the air outlet side.

2. The cooling apparatus of claim 1, wherein the electronic system comprises at least one air-moving device facilitating passage of air through the electronic system from the air inlet side to the air outlet side thereof, and wherein the controller is coupled to the at least one air-moving device for automatically adjusting operation of the at least one air-moving device relative to mode of operation of the cooling apparatus, wherein in the secondary, air-cooling mode, the controller operates the at least one air-moving device at a higher operational speed than in the primary, liquid-cooling mode.

3. The cooling apparatus of claim 2, wherein the controller periodically determines whether adequate facility coolant cooling is available, and responsive to adequate facility coolant cooling being available, operates the cooling apparatus in the primary, liquid-cooling mode, with the at least one air-moving device at a slower operational speed than in the secondary, air-cooling mode, and responsive to inadequate facility coolant cooling being available, determines whether temperature of air flowing to the at least one air-to-liquid heat exchanger is less than temperature of system coolant in the coolant loop returning to the at least one cooling unit, and responsive to temperature of air to the at least one air-to-liquid heat exchanger being less than temperature of system coolant in the coolant loop returning to the at least one cooling unit, automatically operates the at least one air-moving device at the higher operational speed.

4. The cooling apparatus of claim 3, further comprising determining temperature of the at least one electronic component, and setting speed of a clock to the at least one electronic component based on determined temperature thereof.

5. The cooling apparatus of claim 1, wherein the electronic system comprises multiple electronic components and wherein the cooling apparatus is configured to provide, via the coolant loop, system coolant to cool in parallel the multiple electronic components.

6. The cooling apparatus of claim 5, further comprising multiple air-to-liquid heat exchangers, the multiple air-to-liquid heat exchangers being coupled in parallel to the coolant loop to receive coolant therefrom and exhaust coolant thereto, and wherein the multiple air-to-liquid heat exchangers are coupled to the coolant loop downstream of cooling the multiple electronic components, and in the secondary, air-cooling mode, each air-to-liquid heat exchanger of the multiple air-to-liquid heat exchangers facilitates cooling the multiple electronic components, the cooling being independent of a service mode of another air-to-liquid heat exchanger of the multiple air-to-liquid heat exchangers.

7. The cooling apparatus of claim 6, wherein a first air-to-liquid heat exchanger of the multiple air-to-liquid heat exchangers is disposed within the electronic system, and a second air-to-liquid heat exchanger of the multiple air-to-liquid heat exchangers is disposed external to the electronic system.

8. The cooling apparatus of claim 7, wherein the electronic system is an electronics rack and wherein the second air-to-liquid heat exchanger is disposed within another electronics rack.

9. The cooling apparatus of claim 8, wherein the first air-to-liquid heat exchanger is disposed at the air outlet side of the electronics rack for cooling air egressing from the electronics rack in the primary, liquid-cooling mode, and for exhausting heat from the multiple electronic components to air egressing from the electronics rack in the secondary, air-cooling mode, and wherein the second air-to-liquid heat exchanger is disposed at an air outlet side of the another electronics rack for cooling air egressing from the another electronics rack in the primary, liquid-cooling mode, and for exhausting heat from the multiple electronic components of the electronics rack to air egressing from the another electronics rack in the secondary, air-cooling mode.

10. A cooled electronic system comprising;
an electronic system comprising an air inlet side and an air outlet side respectively enabling ingress and egress of air through the electronic system, the electronic system further comprising at least one electronic component; and
a cooling apparatus for facilitating cooling of the electronic system and cooling of air egressing from the electronic system, the cooling apparatus comprising:
at least one cooling unit providing, via a coolant loop, system coolant to cool the at least one electronic component, wherein each cooling unit of the at least one cooling unit comprises a liquid-to-liquid heat exchanger, a first coolant path and a second coolant path, the first coolant path of each cooling unit receiving, in a primary, liquid-cooling mode, facility coolant from a source and passing at least a portion thereof through the liquid-to-liquid heat exchanger, and the second coolant path being coupled in fluid communication with the coolant loop, and providing system coolant to cool the at least one electronic component, and in primary, liquid-cooling mode, expelling heat in the liquid-to-liquid heat exchanger from system coolant in the second coolant path to facility coolant in the first coolant path;
at least one air-to-liquid heat exchanger cooling, in primary, liquid-cooling mode, air exhausting from the electronic system, the at least one air-to-liquid heat exchanger being coupled to the coolant loop to receive system coolant therefrom and exhaust system coolant thereto, wherein the at least one air-to-liquid heat exchanger is coupled to the coolant loop downstream of cooling the at least one electronic component, and in a secondary, air-cooling mode, the at least one air-to-liquid heat exchanger facilitates cooling the at least one electronic component;
a controller to transition the cooling apparatus between the primary, liquid-cooling mode and the secondary, air-cooling mode, wherein in primary, liquid-cooling mode, the at least one cooling unit provides cooled system coolant to cool the at least one electronic component, and provides system coolant to the at least one air-to-liquid heat exchanger for cooling at least a portion of air passing through the electronic system, and in secondary, air-cooling mode, system coolant flows from cooling the at least one electronic component to the at least one air-to-liquid heat exchanger for rejecting, via the system coolant, heat from the at least one electronic component to air passing across the at least one air-to-liquid heat exchanger; and
wherein,the at least one air-to-liquid heat exchagnger is disposed adjacent to the air outlet side of the electronic system and cools in the primary liquid cooling mode, the air exhausting from the electronic system at the air outlet side thereof.

11. The cooled electronic system of claim 10, wherein the electronic system comprises at least one air-moving device for facilitating passage of air through the electronic system from the air inlet side to the air outlet side thereof, and wherein the controller is coupled to the at least one air-moving device for automatically adjusting operation of the at least one air-moving device relative to mode of operation of the cooling apparatus, wherein in the secondary, air-cooling mode, the controller operates the at least one air-moving device at a higher operational speed than in the primary, liquid-cooling mode.

12. The cooled electronic system of claim 11, wherein the controller periodically determines whether adequate facility coolant cooling is available, and responsive to adequate facility coolant cooling being available, operates the cooling apparatus in the primary, liquid-cooling mode, with the at least one air-moving device at a slower operational speed than in the secondary, air-cooling mode, and responsive to inadequate facility coolant cooling being available, determines whether temperature of air to the at least one air-to-liquid heat exchanger is less than temperature of system coolant in the coolant loop returning to the at least one cooling unit, and responsive to temperature of air to the at least one air-to-liquid heat exchanger being less than temperature of system coolant in the coolant loop returning to the at least one cooling unit, automatically operates the at least one air-moving device at the higher operational speed.

13. The cooled electronic system of claim 12, further comprising determining temperature of the at least one electronic component, and setting speed of a clock to the at least one electronic component based on determined temperature thereof.

14. The cooled electronic system of claim 10, wherein the electronic system comprises multiple electronic components and wherein the cooling apparatus is configured to provide, via the coolant loop, system coolant to cool in parallel the multiple electronic components.

15. The cooled electronic system of claim 14, further comprising multiple air-to-liquid heat exchangers, the multiple air-to-liquid heat exchangers being coupled in parallel to the coolant loop to receive coolant therefrom and exhaust coolant thereto, and wherein the multiple air-to-liquid heat exchangers are coupled to the coolant loop downstream of cooling the multiple electronic components, and in the secondary, air-cooling mode, each air-to-liquid heat exchanger of the multiple air-to-liquid heat exchangers facilitates cooling the multiple electronic components, the cooling being independent of a service mode of another air-to-liquid heat exchanger of the multiple air-to-liquid heat exchangers.

16. The cooled electronic system of claim 15, wherein the electronic system is an electronics rack, and the cooled electronic system further comprises another electronics rack, and wherein a first air-to-liquid heat exchanger of the multiple air-to-liquid heat exchangers is disposed within the electronics rack, and a second air-to-liquid heat exchanger of the multiple air-to-liquid heat exchangers is disposed within the another electronics rack.

17. The cooled electronic system of claim 16, wherein the first air-to-liquid heat exchanger is disposed at the air outlet side of the electronics rack for cooling air egressing from the electronics rack in the primary, liquid-cooling mode, and for exhausting heat from the multiple electronic components to air egressing from the electronics rack in the secondary, air-cooling mode, and wherein the second air-to-liquid heat exchanger is disposed at an air outlet side of the another electronics rack for cooling air egressing from the another electronics rack in the primary, liquid-cooling mode, and for exhausting heat from the multiple electronic components of the electronics rack to air egressing from the another electronics rack in the secondary, air-cooling mode.

18. A method of facilitating cooling of an electronic system, the method comprising:

employing at least one cooling unit to provide, via a coolant loop, system coolant to cool at least one electronic component of the electronic system, wherein each cooling unit of the at least one cooling unit comprises a liquid-to-liquid heat exchanger, a first coolant path and a second coolant path, the first coolant path of each cooling unit of the at least one cooling unit receiving, in a primary, liquid-cooling mode, facility coolant from a source and passing at least a portion thereof through the liquid-to-liquid heat exchanger, and the second coolant path being coupled in fluid communication with the coolant loop, and providing system coolant to cool the at least one electronic component, and in primary, liquid-cooling mode, expelling heat in the liquid-to-liquid heat exchanger from system coolant in the second coolant path to facility coolant in the first coolant path;

utilizing at least one air-to-liquid heat exchanger for cooling, in primary, liquid-cooling mode, air exhausting from the electronic system, the at least one air-to-liquid heat exchanger being coupled to the coolant loop to receive system coolant therefrom and exhaust system coolant thereto, wherein the at least one air-to-liquid heat exchanger is coupled to the coolant loop downstream of cooling the at least one electronic component, and in a secondary, air-cooling mode, the at least one air-to-liquid heat exchanger facilitates cooling the at least one electronic component;

transitioning between the primary, liquid-cooling mode and the secondary, air-cooling mode, wherein in primary, liquid-cooling mode, the at least one cooling unit provides cooled system coolant to cool the at least one electronic component, and provides system coolant to the at least one air-to-liquid heat exchanger to cool the air exhausting from the electronic system, and in secondary, air-cooling mode, system coolant flows from cooling the at least one electronic component to the at least one air-to-liquid heat exchanger for rejecting, via the system coolant, heat from the at least one electronic component to air passing across the at least one air-to-liquid heat exchanger; and wherein the electronic system comprises an air inlet side and an air outlet side for respectively enabling ingress and egress of external air through the electronic system the at least one air-to-liquid heat exchanger being disposed adjacent to the air outlet side of the electronic system and cooling in the primary, liquid cooling mode, the air exhausting from the electronic system at the air outlet side.

19. The method of claim 18, wherein the electronic system comprises at least one air-moving device facilitating passage of air through the electronic system from the air inlet side to the air outlet side thereof, wherein the method further comprises automatically adjusting operation of the at least one air-moving device relative to a cooling mode of operation, wherein in the secondary, air-cooling mode, the at least one air-moving device is operated at a higher operational speed than in the primary, liquid-cooling mode.

20. The method of claim 19, further comprising periodically determining whether adequate facility coolant cooling is available, and responsive to adequate facility coolant cooling being available, operating in the primary, liquid-cooling mode, with the at least one air-moving device at a slower operational speed than in the secondary, air-cooling mode, and responsive to inadequate facility coolant cooling being available, ascertaining whether temperature of air to the at least one air-to-liquid heat exchanger is less than temperature of system coolant in the coolant loop returning to the at least one cooling unit, and responsive to temperature of air to the at least one air-to-liquid heat exchanger being less than temperature of system coolant in the cooling loop returning to the at least one cooling unit, operating in the secondary, air-cooling mode, and automatically operating the at least one air-moving device at the higher operational speed.

* * * * *